United States Patent
Saito et al.

(10) Patent No.: US 7,158,354 B2
(45) Date of Patent: Jan. 2, 2007

(54) DUAL-TYPE MAGNETIC DETECTING ELEMENT IN WHICH FREE MAGNETIC LAYER AND PINNED MAGNETIC LAYER HAVE SUITABLY SELECTED β VALUES

(75) Inventors: Masamichi Saito, Niigata-ken (JP); Yosuke Ide, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 541 days.

(21) Appl. No.: 10/642,899

(22) Filed: Aug. 18, 2003

(65) Prior Publication Data

US 2004/0218311 A1 Nov. 4, 2004

(30) Foreign Application Priority Data

Aug. 29, 2002 (JP) .............................. 2002-250692

(51) Int. Cl.
*G11B 5/39* (2006.01)
*G11B 5/127* (2006.01)

(52) U.S. Cl. ................................................. 360/324.12

(58) Field of Classification Search ............. 306/324.1, 306/324.11, 324.12, 324.2

See application file for complete search history.

(56) References Cited

U.S. PATENT DOCUMENTS

| 5,287,238 A | 2/1994 | Baumgart et al. |
| 6,449,134 B1 * | 9/2002 | Beach et al. ............ 360/324.12 |
| 6,621,665 B1 * | 9/2003 | Gill ........................ 360/324.11 |
| 6,807,034 B1 * | 10/2004 | Hasegawa et al. ........ 360/324.2 |
| 2002/0067577 A1 * | 6/2002 | Beach et al. .................. 360/314 |
| 2002/0191348 A1 | 12/2002 | Hasegawa et al. |
| 2003/0184918 A1 * | 10/2003 | Lin et al. ..................... 360/314 |

FOREIGN PATENT DOCUMENTS

| JP | 6-223336 | 8/1994 |
| JP | 8-504303 | 5/1996 |
| JP | 10177706 A * | 6/1998 |
| JP | 11328624 A * | 11/1999 |

* cited by examiner

*Primary Examiner*—William J Klimowicz
(74) *Attorney, Agent, or Firm*—Brinks Hofer Gilson & Lione

(57) ABSTRACT

A first free magnetic layer, a second free magnetic layer, a lower pinned magnetic layer, and an upper pinned magnetic layer are formed of magnetic materials whose β values are suitably set so that the resistances for up-spin conduction electrons of all the magnetic layers become lower than those for down-spin conduction electrons when the magnetization of a free magnetic layer is changed to exhibit a lowest resistance. The magnetic detecting element exhibits an increased change in resistance per area.

13 Claims, 15 Drawing Sheets

FIG. 5

| | CASE 1 | | CASE 2 | |
|---|---|---|---|---|
| | β | γ | β | γ |
| 60 ← | + | | − | |
| 27 | | + | | − |
| 55 ← | | + | | − |
| 71 | + | | − | |
| 54 { 70 | | + | | − |
| 53 → | − | | + | |
| | − | | + | |
| 25 | | − | | + |
| | − | | + | |
| 52 → | − | | + | |

(26 groups 55, 54{71,70}, 53)

DUAL-TYPE MAGNETIC DETECTING ELEMENT IN WHICH FREE MAGNETIC LAYER AND PINNED MAGNETIC LAYER HAVE SUITABLY SELECTED β VALUES

BACKGROUND OF THE INVENTION

1. Field of the Invention

The present invention relates to current-perpendicular-to-plane (CPP) magnetic detecting elements, and particularly to a magnetic detecting element in which change in product of ΔR and cross sectional area 10 (ΔR·A) can be increased effectively.

2. Description of the Related Art

FIG. 14 is a sectional view of a known spin-valve magnetic detecting element.

The spin-valve magnetic detecting element includes a multilayer laminate 9 essentially composed of an antiferromagnetic layer 2, a pinned magnetic layer 3, nonmagnetic material layer 4, a synthetic ferrimagnetic free magnetic layer 5 including a first free magnetic layer 5a, a nonmagnetic interlayer 5b, and a second free magnetic layer 5C, a nonmagnetic material layer 6, a pinned magnetic layer 7, and antiferromagnetic layer 8, deposited in that order. Electrode layers 1 and 10 are disposed on the upper and lower surfaces of the multilayer laminate 9. Also, a hard bias layer 11 lies at both sides of the free magnetic layer 5, and the hard bias layer 11 is provided with insulating layers 12 and 13 on the upper and lower surfaces thereof.

The antiferromagnetic layers 2 and 8 are formed of PtMn; the pinned magnetic layers 3 and 7 and the first free magnetic layer 5a and the second magnetic layer 5c are formed of CoFe; the nonmagnetic interlayer 5b of the free magnetic layer 5 is formed of Ru; the nonmagnetic material layers 4 and 6 are formed of Cu; the hard bias layer 11 is a hard magnetic material such as CoPt; the insulating layers 12 and 13 are formed of alumina; and the electrode layers 1 and 10 are formed of a conductive material such as Cr.

The magnetic detecting element shown in FIG. 14 is a so-called dual spin-valve magnetic detecting element, in which a set of a nonmagnetic material layer and a pinned magnetic layer is provided at both upper and lower sides of a free magnetic layer, and is used for detecting a recording magnetic field from a recording medium, such as a hard disk.

The magnetic detecting element shown in FIG. 14 is also a CPP magnetic detecting element, in which current flows in the direction perpendicular to the surface of each layer in the multilayer laminate 9.

The magnetization of the lower pinned magnetic layer 3 is fixed in the Y direction shown in the figure and the magnetization of the upper pinned magnetic layer 7 is fixed in the direction antiparallel to the Y direction. For example, when the magnetic thickness (saturation magnetization MS×thickness t) of the second free magnetic layer 5c is larger than that of the first free magnetic layer 5a, the magnetization of the second free magnetic layer 5c when an external magnetic field is not applied is oriented to the track width direction (X direction) by a longitudinal bias magnetic field of the hard bias layers 11. Thus, the second free magnetic layer 5c is put into a single magnetic domain state, and the magnetization of the first free magnetic layer 5a is oriented antiparallel to the track width direction. The total magnetization direction of the free magnetic layer 5 is the same as that of the second free magnetic layer 5c, which has a larger magnetic thickness. When an external magnetic field is applied, the magnetizations of the first free magnetic layer 5a and the second free magnetic layer 5c are rotated with an artificial ferrimagnetic state maintained. Consequently the electric resistance of the multilayer laminate 9 is changed. An external magnetic field is detected by transforming the change in electric resistance into a change in voltage or current to draw out.

When a current is applied to a magnetic material, the specific resistance for majority conduction electrons of the magnetic material differs from that for minority conduction electrons.

The magnetic moment of a magnetic atom constituting a magnetic material is defined mainly by the orbital magnetic moments and spin magnetic moments of the electrons in the 3d or 4f orbital. In the 3d or 4d orbital of the magnetic material, the numbers of up-spin electrons and down-spin electrons are basically different from each other. One spin state of up-spin and down-spin states in which a large number of electrons in the 3d or 4f orbital are present is referred to as the majority spin, and the other state, in which a smaller number of electrons are present, is referred to as the minority spin.

On the other hand, the current flowing in the magnetic material contains substantially the same number of up-spin conduction electrons and down-spin conduction electrons. One of the up-spin and down-spin conduction electrons that is in the same spin state as the majority spin of the magnetic material are referred to as the majority conduction electrons, and the other is referred to as the minority conduction electrons.

A characteristic value β of a magnetic material is defined by the following expression:

$$\rho\downarrow/\rho\uparrow = (1+\beta)/(1-\beta)\ (-1\leq\beta\leq 1),$$

where $\rho\downarrow$ represents the specific resistance for minority conduction electrons of the magnetic material and $\rho\uparrow$ represents the specific resistance for majority conduction electrons of the magnetic material.

Hence, when β is positive (β>0), the relationship $\rho\downarrow > \rho\uparrow$ holds and majority conduction electrons flow in the magnetic material more easily than minority conduction electrons. In contrast, when β is negative (β<0), the relationship $\rho\downarrow < \rho\uparrow$ holds and minority conduction electrons flow in the magnetic material more easily.

Also, when a nonmagnetic layer is deposited on a magnetic layer, an interface resistance occurs at the interface between the magnetic layer and the nonmagnetic layer.

The interface resistance for majority conduction electrons is also different from that for minority conduction electrons.

A characteristic value γ of a combination of a magnetic material and a nonmagnetic material is defined by the following expression:

$$r\downarrow/r\uparrow = (1+r)/(1-r)\ (-1\leq\gamma\leq 1),$$

where $r\downarrow$ represents the resistance for the minority conduction electrons at the interface between a magnetic layer and a nonmagnetic layer and $r\uparrow$ represents the resistance for the minority conduction electrons of the interface.

Hence, when γ is positive (γ>0), the relationship $r\downarrow > r\uparrow$ holds and majority conduction electrons flow more easily than minority conduction electrons. In contrast, when γ is negative (γ<0), the relationship $r\downarrow < r\uparrow$ holds and minority conduction electrons flow more easily.

In the magnetic detecting element shown in FIG. 14, the lower pinned magnetic layer 2, the first free magnetic layer 5a, the second free magnetic layer 5c, and the upper pinned magnetic layer 7 generally are formed of CoFe, which is a magnetic material, and CoFe exhibits a positive β. Hence, majority conduction electrons easily flow in the lower pinned magnetic layer 3, the first free magnetic layer 5a, the second free magnetic layer 5c, and the upper pinned magnetic layer 7.

Both the nonmagnetic material layers 4 and 6 are formed of Cu. In this instance, the γ values of the interfaces between the nonmagnetic material layer 4 and the pinned magnetic layer 3, between the nonmagnetic material layer 4 and the first free magnetic layer 5a, between the nonmagnetic material layer 6 and the second free magnetic layer 5c, and between the nonmagnetic material layer 6 and the pinned magnetic layer 7 are all positive.

The nonmagnetic interlayer layer 5b is formed of Ru. In this instance, both the γ values of the interfaces between the first free magnetic layer 5a and the nonmagnetic interlayer 5b and between the second free magnetic layer 5c and the nonmagnetic interlayer 5b are negative.

FIG. 15 illustrates the relationships between β and γ values and the magnetic layers. FIG. 15 schematically shows layers involved in a magnetoresistance effect of the magnetic detecting element shown in FIG. 14. The arrows shown in the lower pinned magnetic layer 3, the first free magnetic layer 5a, the second free magnetic layer 5c, and the upper pinned magnetic layer 7 designate their magnetization directions. In the magnetic layers in which the magnetization is oriented rightward (Y direction) shown in the figure, the majority spin is in an up-spin state. In the magnetic layers in which the magnetization is oriented leftward, the majority spin is a down-spin state. The magnetization directions of the first magnetic layer 5a and the second magnetic layer 5c shown in the figure are those when the magnetic detecting element exhibits a lowest resistance.

In order to increase the change in resistance (ΔR) of the magnetic detecting element, it is preferable when the magnetization of the free magnetic layer 5 is oriented as shown in FIG. 15 that all the resistances for the up-spin conduction electrons of the magnetic layers be lower than those for the down-spin conduction electrons, and that all the interface resistances for the up-spin conduction electrons of the interfaces of the magnetic layers with the nonmagnetic layers (the nonmagnetic material layer 4 and 6 and the nonmagnetic interlayer 5b) be lower than those for the down-spin conduction electrons. Alternatively, it is preferable that all the resistances for the down-spin conduction electrons of the magnetic layers be lower than those for the up-spin conduction electrons, and that all the interface resistances for the down-spin conduction electrons of the interfaces of the magnetic layers with the nonmagnetic layers be lower than those for the up-spin conduction electrons.

However, FIG. 15 suggests that the resistances for up-spin conduction electrons of the pinned magnetic layer 3 and first free magnetic layer 5a, in which the majority spin is up and β is positive, are lower, and that the resistance for up-spin conduction electrons of the second free magnetic layer 5c and pinned magnetic layer 7, in which the majority spin is down and β is positive, are higher.

Also, the interface resistances for up-spin conduction electrons at the interfaces between the nonmagnetic material layer 4 and the pinned magnetic layer 3, between the nonmagnetic material layer 4 and the first free magnetic layer 5a, and between the second free magnetic layer 5c and the nonmagnetic interlayer 5b are lower than those for down-spin conduction electrons. In contrast, the interface resistances for up-spin conduction electrons at the interfaces between the first free magnetic layer 5a and the nonmagnetic interlayer 5b, between the nonmagnetic material layer 6 and the second free magnetic layer 5c, and between the non-magnetic material layer 6 and the pinned magnetic layer 7 are higher than those for down-spin conduction electrons.

Thus, in the known magnetic detecting element, the conduction electron flow has not been efficiently controlled.

SUMMARY OF THE INVENTION

Accordingly, an object of the present invention is to provide a magnetic detecting element in which the change in the product ΔR·A is increased by increasing the difference between ease of electron flow in a low resistance state and that in a high resistance state.

According to an aspect of the present invention, a magnetic detecting element including a multilayer element is provided in which current flow perpendicular to the surface of each layer. The laminate includes a free magnetic layer including a first free magnetic layer, a second free magnetic layer, and a nonmagnetic interlayer between the first free magnetic layer and the second free magnetic layer; a lower nonmagnetic material layer, a lower pinned magnetic layer, and a lower antiferromagnetic layer underlying the free magnetic layer; and an upper nonmagnetic material layer, an upper pinned magnetic layer, and an upper antiferromagnetic layer overlying the free magnetic layer. β of a material constituting one of the first free magnetic layer and the second free magnetic layer has the same sign as β of magnetic materials constituting the lower pinned magnetic layer and the upper pinned magnetic layer, and β of a magnetic material of the other free magnetic layer has a different sigh from β of the magnetic materials constituting the lower pinned magnetic layer and the upper pinned magnetic layer.

β is a characteristic value of a magnetic material satisfying the expression: $\rho\downarrow/\rho\uparrow=(1+\beta)/(1-\beta)(-1\leq\beta\leq1)$, where $\rho\downarrow$ is specific resistance for minority conduction electrons, and $\rho\uparrow$ is specific resistance for majority conduction electrons.

In a dual spin-valve magnetic detecting element in which the magnetizations of the lower pinned magnetic layer and the upper pinned magnetic layer are fixed in a direction parallel to each other, by setting β of the materials constituting the first free magnetic layer, the second free magnetic layer, the lower pinned magnetic layer, and the upper pinned magnetic layer (hereinafter referred to as magnetic layers collectively) as above, the resistances for up-spin conduction electrons of all the magnetic layers become lower than those for down-spin conduction electrons, or the resistances for down-spin conduction electrons of all the magnetic layers become lower than those for up-spin conduction electrons when the magnetization of the free magnetic layer is changed so that the magnetic detecting element has a lowest resistance. Thus, the change in the product ΔR·A of the magnetic detecting element can be increased.

The present invention is also directed to another magnetic detecting element including the same layers as in above and current flows perpendicular to the surface of each layer of the multilayer laminate. β of a material constituting the first free magnetic layer has a sign same as β of a material constituting one of the lower pinned magnetic layer and the upper pinned magnetic layer, and different from β of magnetic materials constituting the second free magnetic layer and the other pinned magnetic layer.

In a dual spin-valve magnetic detecting element in which the magnetization directions of the lower pinned magnetic layer and the upper pinned magnetic layer are antiparallel to each other, by setting β of the materials constituting the magnetic layers as above, the resistances for up-spin conduction electrons of all the magnetic layers become lower than those for down-spin conduction electrons, or the resistances for down-spin conduction electrons of all the magnetic layers become lower than those for up-spin conduction electrons when the magnetization of the free magnetic layer is changed so that the magnetic detecting element has a lowest resistance. Thus, the change in the product ΔR·A of the magnetic detecting element can be increased.

The present invention is directed to another magnetic detecting element having the same structure, except that free magnetic layer includes a first free magnetic layer, a nonmagnetic interlayer, and a second free magnetic layer, a nonmagnetic interlayer, and a third free magnetic layer deposited in that order.

β of magnetic materials constituting the first free magnetic layer and the third free magnetic layer have a sign same as β of a material constituting one of the lower pinned magnetic layer and the upper pinned magnetic layer, and different from β of magnetic materials constituting the second free magnetic layer and the other pinned magnetic layer.

In a dual spin-valve magnetic detecting element in which the magnetizations of the lower pinned magnetic layer and the upper pinned magnetic layer are fixed in a direction parallel to each other, by setting β of the materials constituting the magnetic layers, including the third free magnetic layer, as above, the resistances for up-spin conduction electrons of all the magnetic layers become lower than those for down-spin conduction electrons, or the resistances of all the magnetic layers for down-spin conduction electrons become lower than those for up-spin conduction electrons when the magnetization of the free magnetic layer is changed so that the magnetic detecting element has a lowest resistance. Thus, the change in the product ΔR·A of the magnetic detecting element can be increased.

The present invention is also directed to another magnetic detecting element in which β of materials constituting the first free magnetic layer has a same sign as β of a material constituting the third free magnetic layer, and different from β of a material constituting the second free magnetic layer, and β of the material constituting one of the first free magnetic layer and the second free magnetic layer has the same sign as β of materials, constituting the lower pinned magnetic layer and the upper pinned magnetic layer.

In a dual spin-valve magnetic detecting element in which the magnetization directions of the lower pinned magnetic layer and the upper pinned magnetic layer are antiparallel to each other, by setting β of the materials constituting the magnetic layers as above, the resistances for up-spin conduction electrons of all the magnetic layers become lower than those for down-spin conduction electrons, or the resistances for down-spin conduction electrons of all the magnetic layers become-lower than those for up-spin conduction electrons when the magnetization of the free magnetic layer is changed so that the magnetic detecting element has a lowest resistance. Thus, the change in the product ΔR·A of the magnetic detecting element can be increased.

Preferably, γ of each interface of the magnetic layers with the nonmagnetic material layers and the nonmagnetic interlayers has the same sign as β of the magnetic layer in contact with the interface.

γ is a characteristic value of an interface, satisfying the relationship $r\downarrow/r\uparrow=(1+\gamma)/(1-\gamma)(-1\leq\gamma\leq1)$, where $r\downarrow$ is the interface resistance for minority conduction electrons, and $r\uparrow$ is the interface resistance for majority conduction electrons.

In a dual spin-valve magnetic detecting element, by setting γ as above, the interface resistances for up-spin conduction electrons of all the interfaces of the magnetic layers with the layers formed of a nonmagnetic material (nonmagnetic material layers and the nonmagnetic interlayers) become lower than those for down-spin conduction electrons, or the interface resistances for down-spin conduction electrons of all the interfaces become lower than those for up-spin conduction electrons when the magnetization of the free magnetic layer is changed so that the magnetic detecting element has a lowest resistance. Thus, the change in the product ΔR·A of the magnetic detecting element can be increased.

In order to set γ as above, it may be necessary that the sign of γ of the interface between the upper surface of each nonmagnetic material layer or nonmagnetic interlayer and a magnetic layer is different from the sign of γ of the interface between the lower surface of the nonmagnetic layer or nonmagnetic interlayer and a magnetic layer. In the present invention, however, the nonmagnetic material layer and/or the nonmagnetic interlayer may be formed of different types of nonmagnetic materials in a two-layer structure to solve such a problem.

The present invention is also directed to a magnetic detecting element including a multilayer in which current flows perpendicular to the surface of each layer. The laminate includes a free magnetic layer including a first free magnetic layer, a second free magnetic layer, and a nonmagnetic interlayer between the first free magnetic layer and the second free magnetic layer; a lower nonmagnetic material layer, a lower pinned magnetic layer, and a lower antiferromagnetic underlying the free magnetic layer; and an upper nonmagnetic material layer, an upper pinned magnetic layer, and an upper antiferromagnetic layer overlying the free magnetic layer.

The first free magnetic layer, the second free magnetic layer, the lower pinned magnetic layer, and the upper pinned magnetic layer each comprises an alloy selected from group A consisting of NiX alloys, CoT alloys, FeZ alloys, and Co—Mn—D alloy and group B consisting of NiM alloys, CoQ alloys, and FeA alloys, wherein X of the NiX alloys is an element selected from the group consisting of Co, Fe, Mn, Zr, Hf, Cu, and Au, T of the CoT alloys is an element selected from the group consisting of Fe, Zr, Ta, and Hf, Z of the FeZ alloys is an element selected from the group consisting of Ni, Co, Rh, Pt, Ir, Be, Al, Si, Ga, and Ge, D of the Co—Mn—D alloys is an element selected from the group consisting of Al, Ga, Si, Ge, and Sn, M of the NiM alloys is an element selected from the group consisting of Cr, Rh, Ru, Mo, Nb, Pt, Ir, Os, Re, W, and Ta, Q of the CoQ alloys is an element selected from the group consisting of Mn, Cr, Ru, Mo, Ir, Os, Re, and W, and A of the FeA alloys is an element selected from the group of Mn, Cr, V, Ti, Ru, Mo, Os, Re, and W. One of the first free magnetic layer and the second free magnetic layer, the lower pinned magnetic layer, and the upper pinned magnetic layer comprise an alloy belonging to one of group A and group B, and the other free magnetic layer comprises an alloy belonging to the other group.

In a dual spin-valve magnetic detecting element in which the magnetizations of the lower pinned magnetic layer and the upper pinned magnetic layer are fixed in a direction parallel to each other, by selecting materials of the magnetic layers as above, the resistances for up-spin conduction electrons of all the magnetic layers become lower than those for down-spin conduction electrons, or the resistances for down-spin conduction electrons of all the magnetic layers become lower than those for up-spin conduction electrons when the magnetization of the free magnetic layer is changed so that the magnetic detecting element has a lowest resistance. Thus, the change in the product ΔR·A of the magnetic detecting element can be increased.

The present invention is also directed to a magnetic detecting element including the same layers as in above and current flows perpendicular to the surface of each layer of the multilayer laminate. The first free magnetic layer and one of the lower pinned magnetic layer and the upper pinned magnetic layer comprise an alloy belonging to one of group A and group B, and the second free magnetic layer and the other pinned magnetic layer comprise an alloy belonging to the other group.

In a dual spin-valve magnetic detecting element in which the magnetization directions of the lower pinned magnetic layer and the upper pinned magnetic layer are antiparallel to each other, by selecting materials of the magnetic layers as above, the resistances for up-spin conduction electrons of all the magnetic layers become lower than those for down-spin conduction electrons, or the resistances for down-spin conduction electrons of all the magnetic layers become lower than those for up-spin conduction electrons when the magnetization of the free magnetic layer is changed so that the magnetic detecting element has a lowest resistance. Thus, the change in the product ΔR·A of the magnetic detecting element can be increased.

The present invention is also directed to a magnetic detecting element having the same structure as above, except that the free magnetic layer includes a first free magnetic layer, a nonmagnetic interlayer, a second free magnetic layer, a nonmagnetic interlayer, and a third free magnetic layer deposited in that order. The first free magnetic layer, the third free magnetic layer, and one of the lower pinned magnetic layer and the upper pinned magnetic layer comprise an alloy belonging to one of group A and group B, and the second free magnetic layer and the other pinned magnetic layer comprise an alloy belonging to the other group.

In a dual spin-valve magnetic detecting element in which the magnetizations of the lower pinned magnetic layer and the upper pinned magnetic layer are fixed in a direction parallel to each other, by selecting materials constituting the magnetic layers as above, the resistances for up-spin conduction electrons of all the magnetic layers become lower than those for down-spin conduction electrons, or the resistances of all the magnetic layers for down-spin conduction-electrons become lower than those for up-spin conduction electrons when the magnetization of the free magnetic layer is changed so that the magnetic detecting element has a lowest resistance. Thus, the change in the product ΔR·A of the magnetic detecting element can be increased.

The present invention is also directed to a magnetic detecting element in which the first free magnetic layer and the third free magnetic layer comprise an alloy belonging to one of group A and group B, the second free magnetic layer comprises an alloy belonging to the other group, and the lower pinned magnetic layer and the upper pinned magnetic layer comprise an alloy belonging to the same group as in one of the first free magnetic layer and the second free magnetic layer.

In a dual spin-valve magnetic detecting element in which the magnetization directions of the lower pinned magnetic layer and the upper pinned magnetic layer are antiparallel to each other, by selecting materials of the magnetic layers as above, the resistances for up-spin conduction electrons of all the magnetic layers become lower than those for down-spin conduction electrons, or the resistances for down-spin conduction electrons of all the magnetic layers become lower than those for up-spin conduction electrons when the magnetization of the free magnetic layer is changed so that the magnetic detecting element has a lowest resistance. Thus, the change in the product ΔR·A of the magnetic detecting element can be increased.

Preferably, at least one of the lower nonmagnetic material layer, the upper nonmagnetic material layer, and the nonmagnetic interlayers is a laminate film including a Cu layer and a Cr layer, and the laminate film lies between one of the magnetic layers comprising an alloy belonging to Group A and one of the magnetic layers comprising an alloy belonging to group B. Thus, the resistances of all the magnetic layers for up-spin conduction electrons become lower than those for down-spin conduction electrons, or the resistances of all the magnetic layers for down-spin conduction electrons become lower than those for up-spin conduction electrons, and the change in the product ΔR·A of the magnetic detecting element can be increased.

Each layer constituting the free magnetic layer, the lower nonmagnetic material layer, and the upper nonmagnetic material layer may have a thickness smaller than the specific spin diffusion length of the respective materials constituting the layers.

Preferably, the lower pinned magnetic layer and the upper pinned magnetic layer each comprises two magnetic layers and a nonmagnetic interlayer between the two magnetic layers.

BRIEF DESCRIPTION OF THE DRAWINGS

FIG. 5 is a schematic illustration of a combination of the signs of β of magnetic layers and signs of γ at interfaces of the magnetic layers with nonmagnetic layers in a magnetic detecting element of the present invention;

DESCRIPTION OF THE PREFERRED EMBODIMENTS

Figure 1:
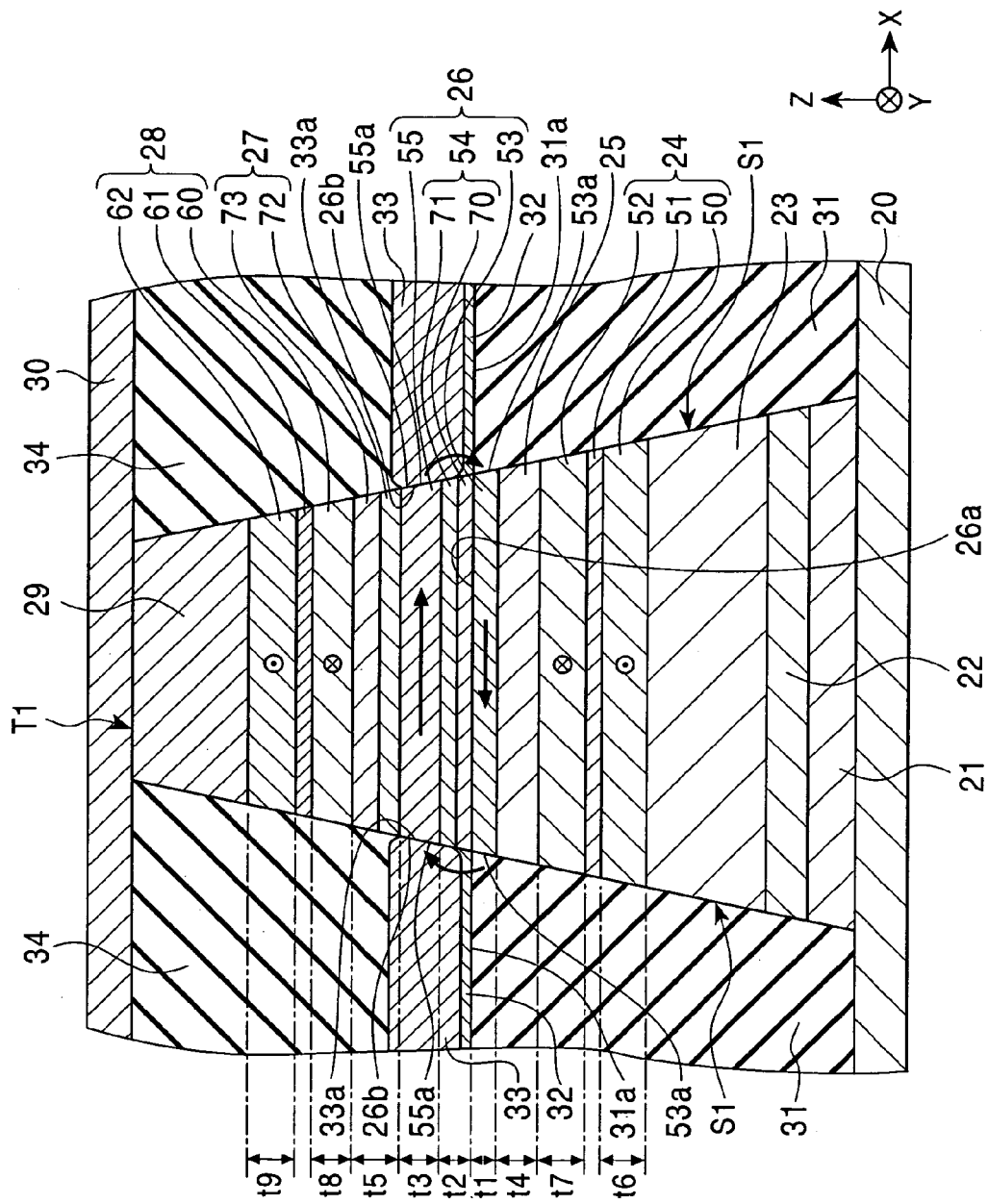
FIG. 1 is a sectional view of a magnetic detecting element according to a first embodiment of the present invention, viewed from a side opposing a recording medium.

FIG. 1 is a fragmentary sectional view of the structure of a magnetic detecting element according to a first embodiment of the present invention, viewed from a side opposing a recording medium.

The magnetic detecting element is a so-called dual spin-valve magnetic detecting element.

The magnetic detecting element include an underlayer 21, a seed layer 22, a lower antiferromagnetic layer 23, a lower pinned magnetic layer 24, having a three-layer ferrimagnetic structure composed of magnetic layers 50 and 52 and a nonmagnetic interlayer 51 formed of, for example, Ru between these magnetic layers, a lower nonmagnetic material layer 25 and a free magnetic layer 26, in that order, on the upper surface at the middle of a first electrode layer 20. The free magnetic layer 26 has a three-layer ferrimagnetic structure composed of first and second free magnetic layers 53 and 55 and a nonmagnetic interlayer 54 between these free magnetic layers. The magnetic detecting element further includes an upper nonmagnetic material layer 27, an upper pinned magnetic layer 28 having a three-layer ferrimagnetic structure composed of magnetic layers 60 and 62 and a nonmagnetic interlayer 61 formed of, for example, Ru between these magnetic layers, an upper antiferromagnetic layer 29, and a second electrode layer 30, in that order, on the upper surface of the free magnetic layer 26.

The layers from the underlayer 21 to the upper antiferromagnetic layer 29 constitute a multilayer laminate T1. At each side in the track width direction (X direction in the figure) of the multilayer laminate T1, an insulating layer 31, bias underlayer 32, hard bias layer 33, and an insulating layer 34 are deposited in that order, as shown in FIG. 1.

The first electrode layer 20 is formed of, for example, α-Ta, Au, Cr, Cu, or W. The underlayer 21 is, preferably, formed of at least one selected from the group consisting of Ta, Hf, Nb, Zr, Ti, Mo, and W. The underlayer 21 has a thickness of 50 Å or less, but it may not be formed.

The seed layer 22 is essentially composed of face-centered cubic crystals and whose (111) plane is preferentially oriented in the direction parallel to the interface with the lower antiferromagnetic layer 23, described later. The seed layer 22 is, preferably, formed of Cr, a NiFe alloy, or a Ni—Fe—Y alloy, wherein Y is at least one selected from the group consisting of Cr, Rh, Ta, Hf, Nb, Zr, and Ti. The (111) plane of the seed layer 22 constituted of these materials has a tendency to preferentially orient in the direction parallel to the interface with the lower antiferromagnetic layer 23 by providing the seed layer 22 on the underlayer 21 formed of, for example, Ta. The seed layer 22 has a thickness of, for example, about 30 Å.

Since the magnetic detecting element of the present invention is of CPP type, in which sense current flows in the direction perpendicular to the surfaces of the layers, the sense current needs to adequately flow through the seed layer 22 as with other layers. It is, therefore, preferable that the seed layer 22 be not formed of a material having a high specific resistance. Specifically, the seed layer 22 is, preferably, formed of a NiFe alloy or other material having a low specific resistance. However, the seed layer 22 may not be formed.

The lower antiferromagnetic layer 23 and the upper antiferromagnetic layer 29 are, preferably, formed of an antiferromagnetic material containing Mn and element X, wherein X is at least one element selected from the group consisting of Pt, Pd, Ir, Rh, Ru, and Os. Alternatively, the lower and upper antiferromagnetic layers 23 and 29 are formed of an antiferromagnetic material containing Mn, element X, and element X', wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and are earth elements.

These antiferromagnetic materials exhibit a high corrosion resistance and a high blocking temperature, and can generate a large exchange anisotropic magnetic field at the interface with the lower pinned magnetic layer 24 or the upper pinned magnetic layer 28. Preferably, the thickness of the lower antiferromagnetic layer 23 and the upper antiferromagnetic layer 29 is in the range of 80 to 300 Å, and, for example, it is 200 Å.

In the present embodiment, the lower pinned magnetic layer 24 and the upper pinned magnetic layer 28 each have a three-layer ferrimagnetic structure.

The lower pinned magnetic layer 24 includes magnetic layers 50 and 52 with the nonmagnetic interlayer 51 formed of a nonmagnetic material therebetween. The upper pinned magnetic layer 28 also includes magnetic layers 60 and 62 with the nonmagnetic interlayer 61 formed of a nonmagnetic material therebetween, as above.

The material of the lower pinned magnetic layer 24 and the upper pinned magnetic layer 28 will be described later. An exchange anisotropic magnetic field is generated between the lower antiferromagnetic layer 23 and the magnetic layer 50 and between the upper antiferromagnetic layer 29 and the magnetic layer 62.

If, for example, the magnetization of the magnetic layer 50 is fixed in a direction opposite to the height direction (Y direction in the figure), the other magnetic layer 52 is magnetized in the height direction by RKKY interaction. If the magnetization of the magnetic layer 62 is fixed in a direction opposite to the height direction, the other magnetic layer 60 is magnetized in the height direction by RKKY interaction.

Thus, the magnetizations of the lower pinned magnetic layer 24 and the upper pinned magnetic layer 28 are stabilized, and the magnetization directions of the lower and upper pinned magnetic layers 24 and 28 can be firmly fixed.

The magnetic layers 50, 52, 60, and 62 of the pinned magnetic layers 24 and 28 each have a thickness in the range of, for example, about 10 to 70 Å. Also, the nonmagnetic interlayers 51 and 61 of the pinned magnetic layers 24 and 28 each have a thickness in the range of, for example, about 3 to 10 Å.

The lower pinned magnetic layer 24 and the upper pinned magnetic layer 28 may not be formed in a ferrimagnetic structure, but formed with a single layer or a laminate composed of magnetic layers.

The lower nonmagnetic material layer 25 and the upper nonmagnetic material layer 27 are formed of a conductive material having a low electric resistance. The thickness of the lower nonmagnetic material layer 25 and the upper nonmagnetic material layer 27 is in the range of, for example, about 25 Å. The material of the lower nonmagnetic material layer 25 and the upper nonmagnetic material layer 27 will be described later.

The free magnetic layer 26 has a three-layer ferrimagnetic structure composed of the first and second free magnetic layers 53 and 55 and the nonmagnetic interlayer 54 between the first and second free magnetic layers.

The first free magnetic layer 53 and the second free magnetic layer 55 are formed of a magnetic material, and the nonmagnetic interlayer 54 is formed of a nonmagnetic material. The magnetization of one of the first free magnetic layer 53 and the second free magnetic layer 55, having a larger magnetic thickness (magnetic moment per area, saturation magnetic flux density Ms×thickness t) is oriented in the X direction in the figure by a longitudinal bias magnetic field from the hard bias layer 33, which is magnetized in the track width direction (X direction), and the magnetization of the other free magnetic layer is oriented in the direction antiparallel to the X direction.

For example, in FIG. 1, since the magnetic thickness of the second free magnetic layer 55 is larger than that of the first free magnetic layer 53, the magnetization of the second free magnetic layer 55 is oriented in the X direction. In contrast, the magnetization of the first free magnetic layer 53 is oriented in the direction antiparallel to the X direction by RKKY interaction.

The total magnetic thickness of the free magnetic layer 26 is defined by the difference in magnetic thickness between the first free magnetic layer 53 and the second free magnetic layer 55. In the artificial ferrimagnetic free magnetic layer 26, the magnetic thickness thereof can be substantially reduced to enhance the sensitivity of the resulting magnetic detecting element, even though the first free magnetic layer 53 and the second free magnetic layer 55 are formed to thicknesses sufficient to ensure the formation of the layers.

The materials and the thicknesses of the first and second free magnetic layers 53 and 55 and the nonmagnetic material layer 54 will be described later.

As shown in FIG. 1, the insulating layer 31 is formed on the first electrode layer 20 at each side in the track width direction of the multilayer laminate T1. The insulating layer 31 is constituted of a common insulative material, such as $Al_2O_3$ or $SiO_2$.

Preferably, the upper surface 31a of the insulting layer 31 is located at a lower position in the figure (opposite direction to the Z direction in the figure) than that of the lower surface 26a of the free magnetic layer 26.

The bias underlayer 32 is formed on the insulating layer 31. Also, the hard bias layer 33 is formed on the bias underlayer 32. The hard bias layer 33 is opposed to each side surface 26b of the free magnetic layer 26. The hard bias layer 33 is magnetized in the track width direction (X direction).

The bias underlayer 32 is intended to enhance properties (coercive force Hc, remanence force S) of the hard bias layer 33.

Preferably, the bias underlayer 32 is formed of a metallic film whose crystals have a body-centered cubic structure (bcc structure). Preferably, the bias underlayer 32 has a (100) plane preferential orientation.

The hard bias layer 33 is formed of a CoPt alloy, a CoPtCr alloy, or the like. These alloys have a hexagonal close-packed (hcp) structure or a combination structure of a face centered cubic (fcc) structure and a hexagonal close-packed (hcp) structure.

Since the bias underlayer 32 formed of the above-mentioned metal and the hcp structure of the CoPt-containing alloy of the hard bias layer 33 have a similar atomic arrangement at the interface therebetween, it is difficult to form a fcc structure, but easy to form a hcp structure in the CoPt-containing alloy. In this instance, the c axis of the hcp structure is preferentially oriented at the interface between the CoPt alloy and the bias underlayer. Since an hcp structure produces a larger magnetic anisotropy in the c-axis direction than an fcc structure does, the coercive force Hc increases when a magnetic field is applied to the hard bias layer 33. In addition, since the c axis of the hcp structure is preferentially oriented at the interface between the CoPt alloy and the bias underlayer, the residual magnetization increases. Consequently, the remanence ratio S, which is derived from residual magnetization/saturation magnetic flux density, increases. As a result, characteristics of the hard bias layer 33 can be enhanced and, thus, a bias magnetic field generated from the hard bias layer 33 can be increased. The metallic film whose crystals have a body-centered cubic structure (bcc structure) is, preferably, formed of at least one element selected from the group consisting of Cr, W, Mo, V, Mn, Nb, and Ta.

Although the bias underlayer 32 is preferably provided only under the hard bias layer 33, it may additionally be provided between both side surfaces 26b of the free magnetic layer 26 and the hard bias layer 33 to same extent. In this instance, preferably, the thickness in the track width direction of the bias underlayer 32 between the side surfaces 26b of the free magnetic layer 26 and the hard bias layer 33 is 1 nm or less.

Thus, the hard bias layer 33 and the free magnetic layer 26 are magnetically coupled continuously. Consequently, the magnetic domain of the free magnetic layer 26 can easily be controlled without buckling in which the ends of the free magnetic layer 26 are negatively affected by a demagnetizing field.

In the magnetic detecting element shown in FIG. 1, the first free magnetic layer 53 and second free magnetic layer 55 of the free magnetic layer 26 are put into a single magnetic domain state by the hard bias layer 33. If the magnetizations of the first free magnetic layer 53 and the second free magnetic layer 55 are oriented antiparallel, as in the present embodiment, it is preferable that the internal side surfaces 33a of the hard bias layer 33 oppose only the ends of one of the first free magnetic layer 53 and the second free magnetic layer 55. FIG. 1 shows that the internal side surfaces 33a of the hard bias layer 33 oppose only the ends 55a of the second free magnetic layer 55. Consequently, a longitudinal bias magnetic field from the hard bias layer 33 in the track width direction (X direction) directly acts on the second free magnetic layer 55, thus suppressing or preventing the disorder of the magnetization of the first free magnetic layer 53, which is antiparallel to the track width direction.

The hard bias layer 33 is provided with the insulating layer 34, as shown in FIG. 1. The insulating layer 34 is formed of a common insulating material such as $Al_2O_3$ or $SiO_2$. In the present embodiment, each upper surface of the insulating layer 34 is flush with the upper surface of the antiferromagnetic layer 29.

The second electrode layer 30 is formed on the insulating layer 34 and the antiferromagnetic layer 29.

Although sense current flows from the second electrode layer 30 to the first electrode layer 20 in the present embodiment, the sense current may flow from the first electrode layer 20 to the second electrode layer 30. Hence, the sense current flows in the direction perpendicular to the surfaces of the layers of the magnetic detecting element. This sense current flow is of CPP type.

When a sense current is applied to the upper pinned magnetic layer 28, the upper nonmagnetic material layer 27, and the free magnetic layer 26, the lower nonmagnetic material layer 25, and the lower pinned magnetic layer 24 and a leak magnetic field is applied in the Y direction from a recording medium that runs in the Z direction, such as a hard disk, the magnetization of the free magnetic layer 26 is changed from the X direction to the Y direction. The electric resistance is changed according to the relationship between the magnetization directions of the first free magnetic layer 53 and the magnetic layer 52 of the lower pinned magnetic layer 24 and the relationship between the second free magnetic layer 55 and the magnetic layer 60 of the upper pinned magnetic layer 28 (this is the magnetic magnetoresistance effect). A weak magnetic field from a recording medium is detected based on a change in voltage or current corresponding to the change in electric resistance.

In the magnetic detecting element shown in FIG. 1, both end surfaces S1 in the track width direction (X direction) of the multilayer laminate T1, which includes the underlayer 21, the seed layer 22, the lower antiferromagnetic layer 23, the lower pinned magnetic layer 24, the lower nonmagnetic material layer 25, the free magnetic layer 26, the upper nonmagnetic material layer 27, the upper pinned magnetic layer 28, and the upper antiferromagnetic layer 29, forms a continuous inclined plane.

Characteristic features of the magnetic detecting element shown in FIG. 1 will now be described.

In the magnetic detecting element, the change in the product $\Delta R \cdot A$ is increased by suitably selecting materials of the lower pinned magnetic layer 24, the lower nonmagnetic material layer 25, the free magnetic layer 26, the upper nonmagnetic material layer 27, and the upper pinned magnetic layer 28 according to a specific rule of the present invention.

The materials of the lower pinned magnetic layer 24, the free magnetic layer 26, and the upper pinned magnetic layer 28 are selected as follows.

Case 1

The first free magnetic layer 53, the magnetic layer 52 of the lower pinned magnetic layer 24, the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The second free magnetic layer 55 is formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The lower nonmagnetic material layer 25 is formed of Cu. The nonmagnetic interlayer 54 of the free magnetic layer 26 is a laminate composed of a first layer 70 formed of Cu and a second layer 71 formed of Cr. The upper nonmagnetic material layer 27 is also a laminate composed of a first layer 72 formed of Cr and a second layer 73 formed of Cu.

Case 2

The first free magnetic layer 53, the magnetic layer 52 of the lower pinned magnetic layer 24, and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W The second free magnetic layer 55 is formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The lower nonmagnetic material layer 25 is formed of Cr. The nonmagnetic interlayer 54 of the free magnetic layer 26 is a laminate composed of a first layer 70 formed of Cr and a second layer 71 formed of Cu. The upper nonmagnetic material layer 27 is also a laminate composed of a first layer 72 formed of Cu and a second layer 73 formed of Cr.

The magnetic layer 50 of the lower pinned magnetic layer 24 is formed of the same material as that of the magnetic layer 52 and the magnetic layer 62 of the upper pinned magnetic layer 28 is formed of the same material as that of the magnetic layer 60.

When the NiX alloys, CoT alloys, FeZ alloys, and Co—Mn—D alloys belong to group A and the NiM alloys, CoQ alloys, and FeA alloys belong to group B, the alloys belonging to group A satisfies the relationship $\beta>0$, and the alloys belonging to group B satisfies the relationship $\beta<0$. Exemplary composition of the NiX alloys may be $Ni_{80}Fe_{20}$, and exemplary composition of the FeA alloys may be $Fe_{90}Cr_{10}$.

$\beta$ is a characteristic value of a magnetic material, satisfying the relationship $\rho\downarrow/\rho\uparrow=(1+\beta)/(1-\beta)(-1\leq\beta\leq1)$, wherein $\rho\downarrow$ is the specific resistance for minority conduction electrons and $\rho\uparrow$ is the specific resistance for majority conduction electrons. Hence, when $\beta$ is positive ($\beta>0$), the relationship $\rho\downarrow>\rho\uparrow$ holds and majority conduction electrons flow in the magnetic material more easily than minority conduction electrons. In contrast, when $\beta$ is negative ($\beta<0$), the relationship $\rho\downarrow<\rho\uparrow$ holds and minority conduction electrons flow in the magnetic material more easily.

The signs of $\gamma$ at the interfaces between the magnetic layer 52 of the lower pinned magnetic layer 24 and the lower nonmagnetic material layer 25, between the lower nonmagnetic material layer 25 and the first free magnetic layer 53, between the first free magnetic layer 53 and the nonmagnetic interlayer 54, between the nonmagnetic interlayer 54 and the second free magnetic layer 55, between the second free magnetic layer 55 and the upper nonmagnetic material layer 27, between the upper nonmagnetic material layer 27 and the magnetic layer 60 of the upper pinned magnetic layer 28 are the same as the signs of β values of the respective magnetic layers in contact with the interfaces.

γ is a characteristic value at an interface, satisfying the relationship $r\downarrow/r\uparrow=(1+\gamma)/(1-\gamma)(-1\leq\gamma\leq1)$, wherein $r\downarrow$ is the interface resistance for minority conduction electrons, and $r\uparrow$ is the interface resistance for majority conduction electrons. Hence, when γ is positive (γ>0), the relationship $r\downarrow>r\uparrow$ holds and majority conduction electrons flow more easily than minority conduction electrons. In contrast, when γ is negative (γ<0), the relationship $r\downarrow<r\uparrow$ holds and minority conduction electrons flow more easily.

When current flows in a conductive material, conduction electrons change the direction of their spins after traveling a certain distance. A distance at which the conduction electrons travel without changing the direction of their spins is referred to as a spin diffusion length. A conductive material has a specific spin diffusion length.

In the present embodiment, the thickness t1 of the first free magnetic layer 53, the thickness t2 of the nonmagnetic interlayer 54, the thickness t3 of the second free magnetic layer 55, the thickness t4 of the lower nonmagnetic material layer 25, and the thickness t5 of the upper nonmagnetic material layer 27 are all smaller than the spin diffusion lengths of the materials constituting the respective layers.

Therefore, when, for example, the conduction electrons involved in the magnetoresistance effect are in an up-spin state, the up-spin conduction electrons travel through the upper nonmagnetic material layer 27, the first free magnetic layer 53, the nonmagnetic interlayer 54, the second free magnetic layer 55, and the lower nonmagnetic material layer 25, maintaining the uniformity of the spin direction.

For example, the spin diffusion lengths are: 150 Å in $Co_{90}Fe_{10}$; 120 Å in $Ni_{80}Fe_{20}$; 50 Å in $Ni_{97}Cr_3$; 90 Å in $Fe_{95}Cr_5$; 40 Å in $Fe_{80}Cr_{20}$; 1000 Å in Cu; and 100 Å in Cr.

Figure 2:
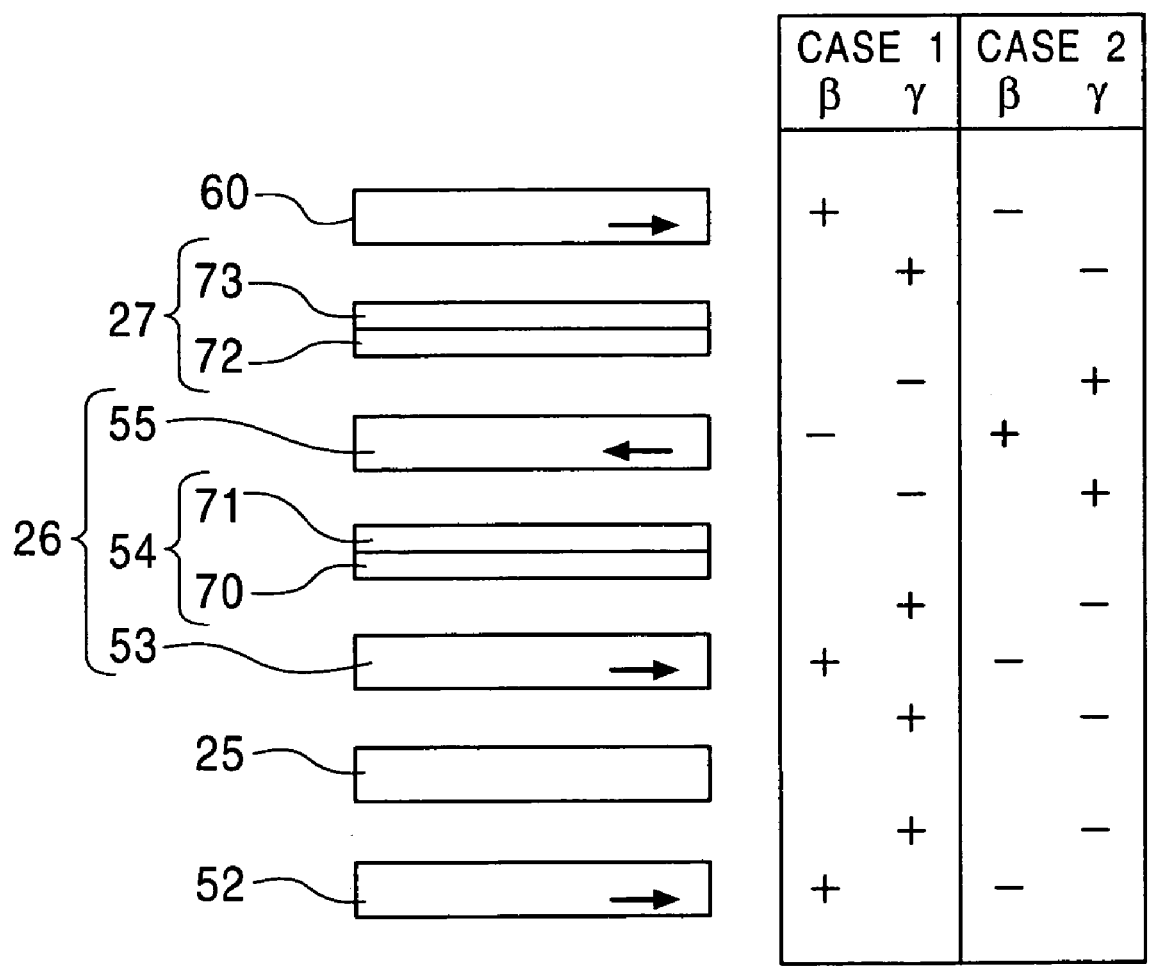
FIG. 2 is a schematic illustration of a combination of the signs of β of magnetic layers and the signs of γ at interfaces of the magnetic layers with nonmagnetic layers in a magnetic detecting element of the present invention.

FIG. 2 shows the relationships between the magnetic layers and the characteristic values β and γ in the combinations of Case 1 and Case 2, and schematically shows layers involved in a magnetoresistance effect of the magnetic detecting element shown in FIG. 1. The arrows shown in the magnetic layer 52 of the lower pinned magnetic layer 24, the first free magnetic layer 53, the second free magnetic layer 55, and the magnetic layer 60 of the upper pinned magnetic layer 28 designate their magnetization directions. The majority spin in the magnetic layers in which the magnetization is oriented rightward shown in the figure is up-spin, and the majority spin in the magnetic layers in which the magnetization is oriented leftward is down-spin. The magnetization directions of the first free magnetic layer 53 and the second free magnetic layer 55 are those when the magnetic detecting element exhibits the lowest resistance.

FIG. 2 suggests that, in Case 1, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayer 54, upper nonmagnetic material layer 27) are smaller than those for the down-spin conduction electrons.

Also, in Case 2, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayer 54, upper nonmagnetic material layer 27) are smaller than those for the up-spin conduction electrons.

Therefore, the difference between the ease of conduction electron flow in a low resistance state and that in a high resistance state can be increased, and, thus, the change in the product ΔR·A can be increased.

The lower pinned magnetic layer 24, the lower nonmagnetic material layer 25, the free magnetic layer 26, the upper nonmagnetic material layer 27, and the upper pinned magnetic layer 28 may be formed with the following combination of materials.

Case 3

The second free magnetic layer 55, the magnetic layer 52 of the lower pinned magnetic layer 24, the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The first free magnetic layer 53 is formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The lower nonmagnetic material layer 25 is a laminate composed of a first layer 74 formed of Cu and a second layer 75 formed of Cr. The nonmagnetic interlayer 54 of the free magnetic layer 26 is a laminate composed of a first layer 70 formed of Cr and a second layer 71 formed of Cu. The upper nonmagnetic material layer 27 is formed of Cu.

Case 4

The second free magnetic layer 55, the magnetic layer 52 of the lower pinned magnetic layer 24, and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The first free magnetic layer 53 is formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The lower nonmagnetic material layer 25 is a laminate composed of a first layer 74 formed of Cr and a second layer 75 formed of Cu. The nonmagnetic interlayer 54 of the free magnetic layer 26 is a laminate composed of a first layer 70 formed of Cu and a second layer 71 formed of Cr. The upper nonmagnetic material layer 27 is formed of Cr.

Figure 3:
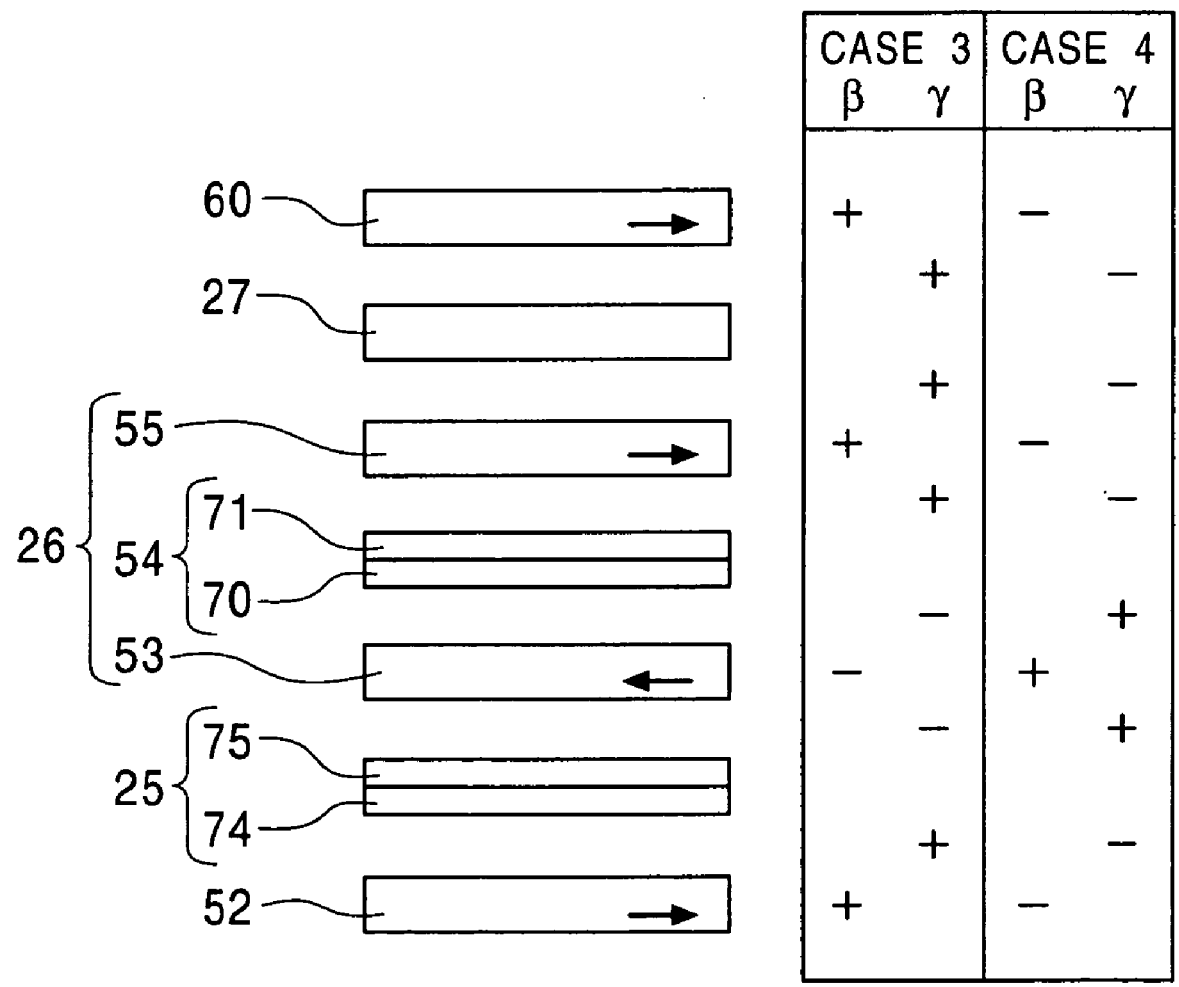
FIG. 3 is a schematic illustration of a combination of the signs of β of magnetic layers and signs of γ at interfaces of the magnetic layers with nonmagnetic layers in a magnetic detecting element of the present invention.

FIG. 3 shows the relationships between the magnetic layers and the characteristic values β and γ in the combinations of Case 3 and Case 4. The arrows shown in the magnetic layer 52 of the lower pinned magnetic layer 24, the first free magnetic layer 53, the second free magnetic layer 55, and the magnetic layer 60 of the upper pinned magnetic layer 28 designate their magnetization directions. FIG. 3 is different from FIG. 2 in that the lower nonmagnetic material layer 25 has a two-layer structure composed of the first layer 74 and the second layer 75, but the upper nonmagnetic material layer 27 has a single-layer structure.

The majority spin in the magnetic layers in which the magnetization is oriented rightward shown in the figure is up-spin, and the majority spin in the magnetic layers in which the magnetization is oriented leftward is down-spin, as above. The magnetization directions of the first free magnetic layer 53 and the second free magnetic layer 55 are those in which the magnetic detecting element exhibits the lowest resistance.

FIG. 3 suggests that, in Case 3, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayer 54, upper nonmagnetic material layer 27) are smaller than those for the down-spin conduction electrons.

Also, in Case 4, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayer 54, upper nonmagnetic material layer 27) are smaller than those for the up-spin conduction electrons.

Therefore, the difference between the ease of conduction electron flow in a low resistance state and that in a high resistance state can be increased, and, thus, the change in the product ΔR·A can be increased.

In FIGS. 2 and 3, the magnetizations of the magnetic layer 52 of the lower pinned magnetic layer 24 and the magnetic layer 60 of the upper pinned magnetic layer 28 are oriented parallel to each other.

Figure 4:
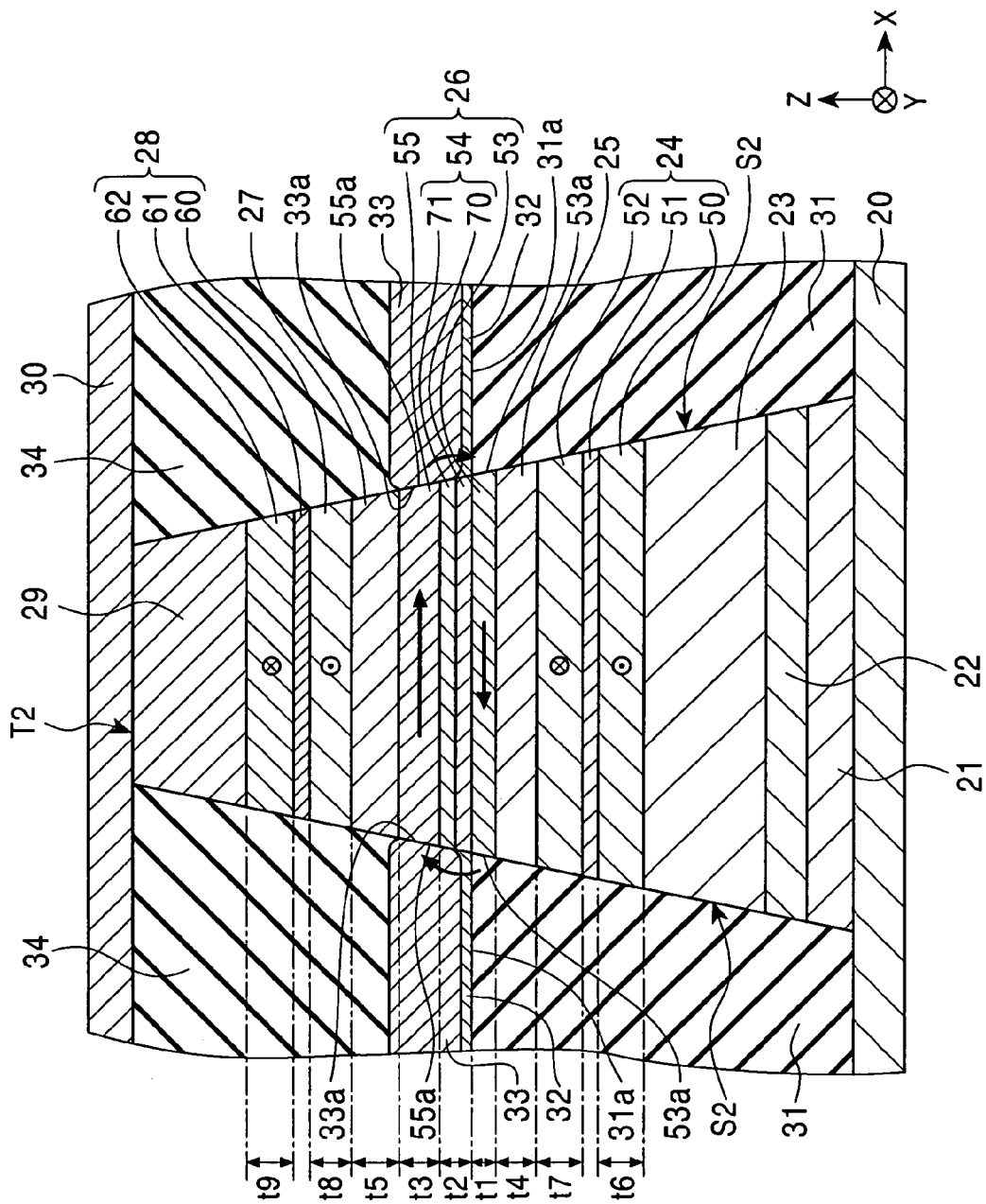
FIG. 4 is a sectional view of a magnetic detecting element according to a second embodiment of the present invention, viewed from a side opposing a recording medium.

FIG. 4 is a fragmentary sectional view of the structure of a magnetic detecting element according to a second embodiment of the present invention, viewed from a side opposing a recording medium.

The magnetic detecting element shown in FIG. 4 is different from the magnetic detecting element shown in FIG. 1 in that only the nonmagnetic interlayer 54 of the free magnetic layer 26 in the nonmagnetic layers 54 has a two-layer structure, but the lower nonmagnetic material layer 25 and the upper nonmagnetic material layer 27 do not. The magnetization of the magnetic layer 50 of the lower pinned magnetic layer 24 is fixed in a direction antiparallel to the magnetization direction of the magnetic layer 62 of the upper pinned magnetic layer 28. As a result, the magnetization of the magnetic layer 52 of the lower pinned magnetic layer 24 is oriented antiparallel to the magnetization direction of the magnetic layer 60 of the upper pinned magnetic layer 28.

The other layers, designated by the same reference numerals as in FIG. 1, are formed of the same materials and the same thicknesses, and the description is not repeated.

The materials of the lower pinned magnetic layer 24, the free magnetic layer 26, and the upper pinned magnetic layer 28 of the magnetic detecting element shown in FIG. 4 are selected as follows.

Case 1

The second free magnetic layer 55 and the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The first free magnetic layer 53 and the magnetic layer 52 of the lower pinned magnetic layer 24 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of FeA alloy is an element selected from the group consisting of Mn, Cr, V, Ti, Ru, Mo, Os, Re, and W.

The nonmagnetic interlayer 54 of the free magnetic layer 26 is a laminate composed of a first layer 70 formed of Cr and a second layer 71 formed of Cu. The upper nonmagnetic material layer 27 is formed of Cu.

Case 2

The second free magnetic layer 55 and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The first free magnetic layer 53 and the magnetic layer 52 of the lower pinned magnetic layer 24 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The lower nonmagnetic material layer 25 is formed of Cu. The nonmagnetic interlayer 54 of the free magnetic layer 26 is a laminate composed of a first layer 70 formed of Cu and a second layer 71 formed of Cr. The upper nonmagnetic material layer 27 is formed of Cr.

The magnetic layer 50 of the lower pinned magnetic layer 24 is formed of the same material as that of the magnetic layer 52 and the magnetic layer 62 of the upper pinned magnetic layer 28 is formed of the same material as that of the magnetic layer 60.

When the NiX alloys, CoT alloys, FeZ alloys, and Co—Mn—D alloys belong to group A, and the NiM alloys, CoQ alloys, and FeA alloys belong to group B, the alloys belonging to group A are magnetic materials satisfying the relationship β>0, and the alloys belonging to group B are magnetic materials satisfying the relationship β<0, as above.

The signs of γ at the interfaces between the magnetic layer 52 of the lower pinned magnetic layer 24 and the lower nonmagnetic material layer 25, between the lower nonmagnetic material layer 25 and the first free magnetic layer 53, between the first free magnetic layer 53 and the nonmagnetic interlayer 54, between the nonmagnetic interlayer 54 and the second free magnetic layer 55, between the second free magnetic layer 55 and the upper nonmagnetic material layer 27, between the upper nonmagnetic material layer 27 and the magnetic layer 60 of the upper pinned magnetic layer 28 are the same as the signs of β values of the respective magnetic layers in contact with the interfaces.

In the present embodiment, the thickness t1 of the first free magnetic layer 53, the thickness t2 of the nonmagnetic interlayer 54, the thickness t3 of the second free magnetic layer 55, the thickness t4 of the lower nonmagnetic material layer 25, and the thickness t5 of the upper nonmagnetic material layer 27 are all smaller than the spin diffusion lengths of the materials constituting the respective layers.

Therefore, when, for example, the conduction electrons involved in the magnetoresistance effect are in an up-spin state, the up-spin conduction electrons travel through the upper nonmagnetic material layer 27, the second free magnetic layer 55, the nonmagnetic interlayer 54, the first free magnetic layer 53, and the lower nonmagnetic material layer 25, maintaining the uniformity of the spin direction.

FIG. 5 shows the relationships between the magnetic layers and the characteristic values β and γ in the combinations of Case 1 and Case 2, and schematically shows layers involved in a magnetoresistance effect of the magnetic detecting element shown in FIG. 4. The arrows shown in the magnetic layer 52 of the lower pinned magnetic layer 24, the first free magnetic layer 53, the second free magnetic layer 55, and the magnetic layer 60 of the upper pinned magnetic layer 28 designate their magnetization directions. The majority spin in the magnetic layers in which the magnetization is oriented rightward shown in the figure is up-spin, and the majority spin in the magnetic layers in which the magnetization is oriented leftward is down-spin. The magnetization directions of the first free magnetic layer 53 and the second free magnetic layer 55 are those when the magnetic detecting element exhibits the lowest resistance.

FIG. 5 suggests that, in Case 1, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayer 54, upper nonmagnetic material layer 27) are smaller than those for the down-spin conduction electrons.

Also, in Case 2, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayer 54, upper nonmagnetic material layer 27) are smaller than those for the up-spin conduction electrons.

Therefore, the difference between the ease of conduction electron flow in a low resistance state and that in a high resistance state can be increased, and, thus, the change in the product ΔR·A can be increased.

The lower pinned magnetic layer 24, the lower nonmagnetic material layer 25, the free magnetic layer 26, the upper nonmagnetic material layer 27, and the upper pinned magnetic layer 28 may be formed with the following combination of materials.

Case 3

The first free magnetic layer 53 and the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The second free magnetic layer 55 and the magnetic layer 52 of the lower pinned magnetic layer 24 is formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The lower nonmagnetic material layer 25 is a laminate composed of a first layer 74 formed of Cr and a second layer 75 formed of Cu. The nonmagnetic interlayer 54 of the free magnetic layer 26 is a laminate composed of a first layer 70 formed of Cu and a second layer 71 formed of Cr. The upper nonmagnetic material layer 27 is a laminate composed of a first layer 72 formed of Cr and a second layer 73 formed of Cu.

Case 4

The first free magnetic layer 53 and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The second free magnetic layer 55 and the magnetic layer 52 of the lower pinned magnetic layer 24 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The lower nonmagnetic material layer 25 is a laminate composed of a first layer 74 formed of Cu and a second layer 75 formed of Cr. The nonmagnetic interlayer 54 of the free magnetic layer 26 is a laminate composed of a first layer 70 formed of Cr and a second layer 71 formed of Cu. The upper nonmagnetic material layer 27 is a laminate composed of a first layer 72 formed of Cu and a second layer 73 formed of Cr.

Figure 6:
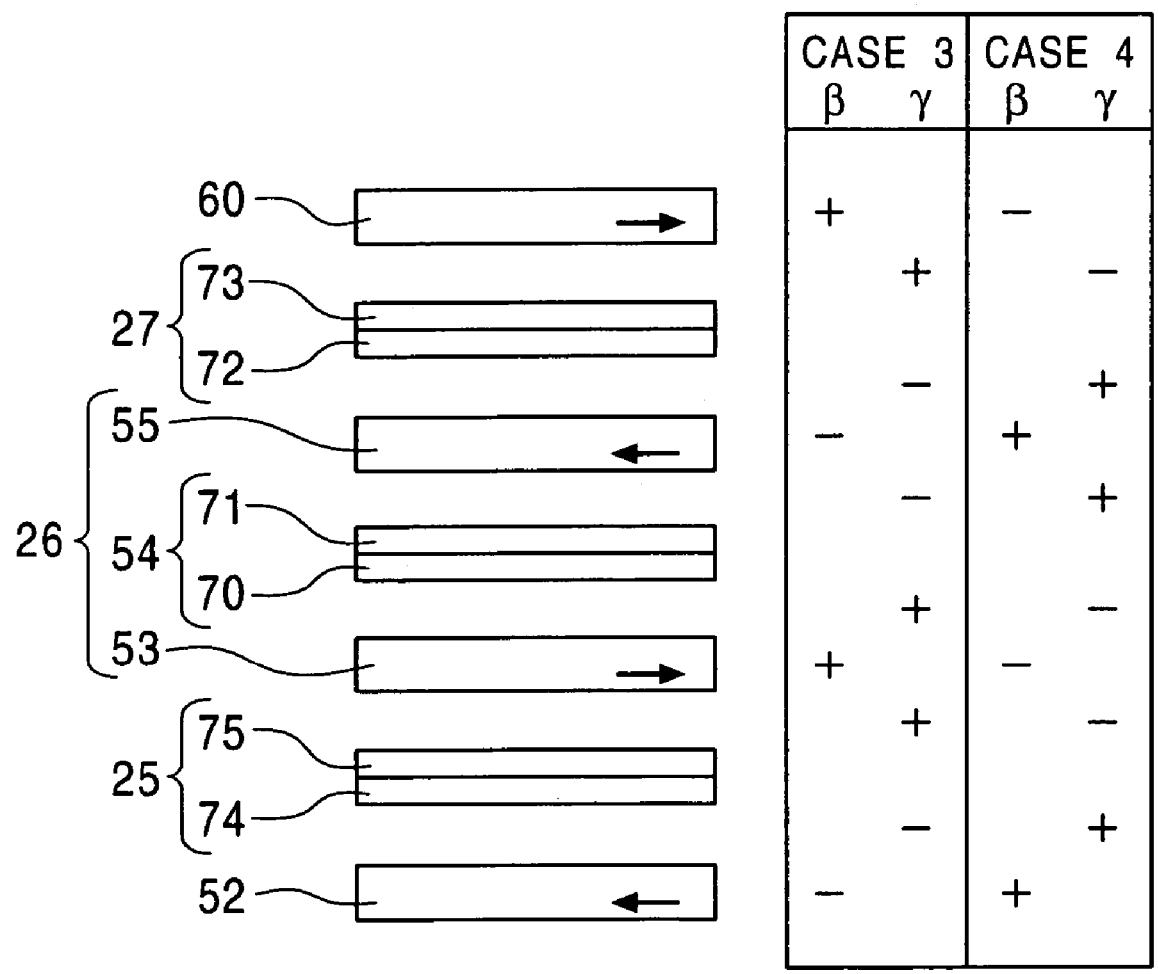
FIG. 6 is a schematic illustration of a combination of the signs of β of magnetic layers and signs of γ at interfaces of the magnetic layers with nonmagnetic layers in a magnetic detecting element of the present invention.

FIG. 6 shows the relationships between the magnetic layers and the characteristic values β and γ in the combinations of Case 3 and Case 4. The arrows shown in the magnetic layer 52 of the lower pinned magnetic layer 24, the first free magnetic layer 53, the second free magnetic layer 55, and the magnetic layer 60 of the upper pinned magnetic layer 28 designate their magnetization directions. FIG. 6 is different from FIG. 5 in that the lower nonmagnetic material layer 25 and the upper nonmagnetic material layer 27 each have a two-layer structure composed of the first layer 74 or 72 and the second layer 75 or 73.

The majority spin in the magnetic layers in which the magnetization is oriented rightward shown in the figure is up-spin, and the majority spin in the magnetic layers in which the magnetization is oriented leftward is down-spin, as above. The magnetization directions of the first free magnetic layer 53 and the second free magnetic layer 55 are those when the magnetic detecting element exhibits the lowest resistance.

FIG. 6 suggests that, in Case 3, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayer 54, upper nonmagnetic material layer 27) are smaller than those for the down-spin conduction electrons.

Also, in Case 4, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayer 54, upper nonmagnetic material layer 27) are smaller than those for the up-spin conduction electrons.

Therefore, the difference between the ease of conduction electron flow in a low resistance state and that in a high resistance state can be increased, and, thus, the change in the product $\Delta R \cdot A$ can be increased.

In FIGS. 5 and 6, the magnetization directions of the magnetic layer 52 of the lower pinned magnetic layer 24 and the magnetic layers 60 of the upper pinned magnetic layer 28 are antiparallel.

Figure 7:
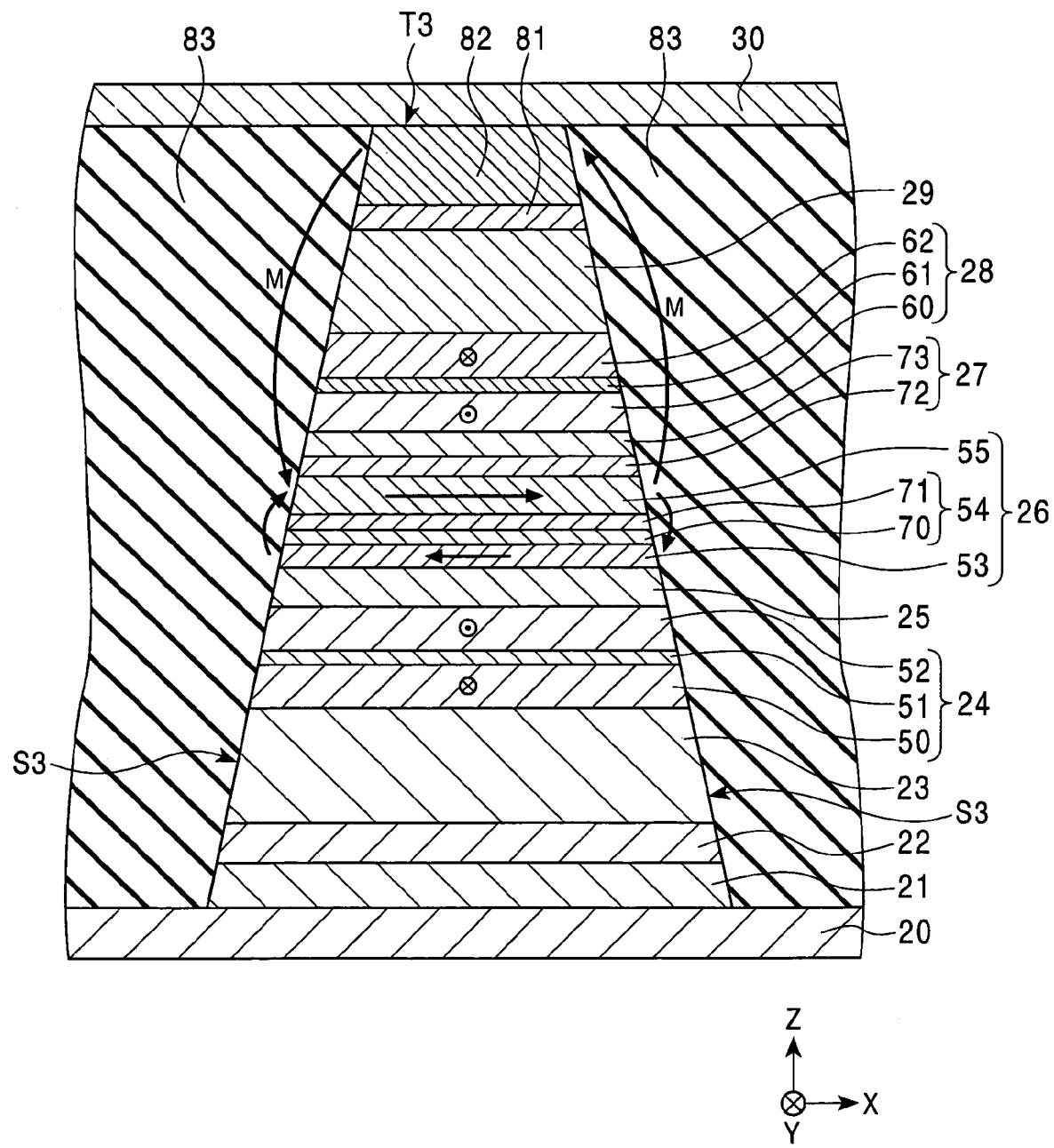
FIG. 7 is a sectional view of a magnetic detecting element according to a third embodiment of the present invention, viewed from a side opposing a recording medium.

FIG. 7 is a fragmentary sectional view of the structure of a magnetic detecting element according to a third embodiment of the present invention, viewed from a side opposing a recording medium.

The magnetic detecting element shown in FIG. 7 is similar to the magnetic detecting element shown in FIG. 1, but different in the way to apply a longitudinal bias magnetic field to the free magnetic layer 26.

The layers designated by the same reference numerals as in FIG. 1 are the same layer formed of the same materials having the same thicknesses as those in FIG. 1, unless otherwise described.

In the magnetic detecting element shown in FIG. 7, an in-stack bias layer 82 is formed on the upper antiferromagnetic layer 29 with an intermediate layer 81 therebetween, instead of providing the hard bias layer at both sides of the free magnetic layer 26. The layers from the underlayer 21 to the in-stack bias layer 82 constitute a multilayer laminate T3.

The in-stack bias layer 82 is formed of a hard magnetic material, such as CoPt, and is magnetized in the direction antiparallel to the X direction shown in the figure. The in-stack bias layer 82 and the intermediate layer 81 may have a Cr base layer therebetween. The intermediate layer 81 is formed of a nonmagnetic conductive material, such as Ta, W, Mo, Cr, and Cu.

In the present embodiment, a longitudinal bias magnetic field (static magnetic field) is applied from both sides of the in-stack bias layer 82 to the free magnetic layer 26 (as designated by arrow M), so that magnetization of the second free magnetic layer 55 is oriented in the X direction.

The magnetic moment per area of the second free magnetic layer 55 is larger than that of the first free magnetic layer 53, thus stabilizing the magnetization of the second free magnetic layer 55 that is oriented to the same direction as that of the longitudinal bias magnetic field applied from the in-stack bias layer 82.

In the magnetic detecting element having the in-stack bias layer 82, shown in FIG. 7, the magnetic domain of the free magnetic layer 26 can suitably be controlled without magnetizing the free magnetic layer 26 hard. Thus, the magnetization of the free magnetic layer 26 can be favorably changed by an external magnetic field. An insulating layer 83 is formed of alumina or $SiO_2$ at both sides S3 of the multilayer laminate T3. Consequently, loss of sense current by diversion can be reduced.

Although the in-stack bias layer 82 is provided only on the upper antiferromagnetic layer 29 in the magnetic detecting element shown in FIG. 7, it may be provided under the lower antiferromagnetic layer 23, or both on the upper antiferromagnetic layer 29 and under the lower antiferromagnetic layer 23.

However, it is preferable to provide an in-stack bias layer either on the upper antiferromagnetic layer 29 or under the lower antiferromagnetic layer 23, from the viewpoint of setting the magnetization directions of the first free magnetic layer 53 and the second free magnetic layer 55 to be antiparallel. In addition, the thickness of one layer of the first free magnetic layer 53 and the second free magnetic layer 55, closer to the in-stack bias layer is preferably set larger than that of the other.

Figure 8:
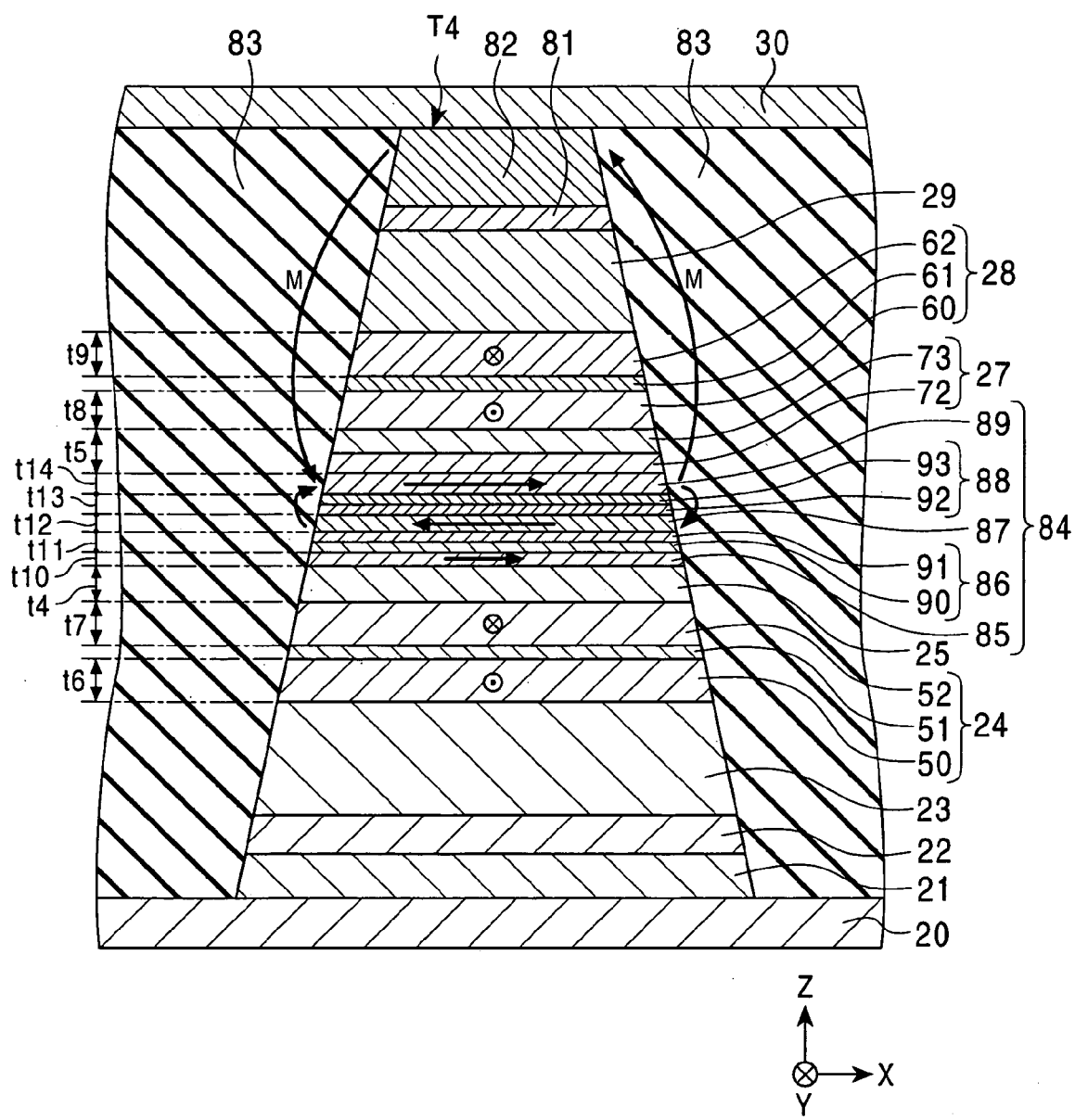
FIG. 8 is a sectional view of a magnetic detecting element according to a fourth embodiment of the present invention, viewed from a side opposing a recording medium.

FIG. 8 is a fragmentary sectional view of the structure of a magnetic detecting element according to a fourth embodiment of the present invention, viewed from a side opposing a recording medium.

The magnetic detecting element shown in FIG. 8 is similar to the magnetic detecting element shown in FIG. 7, but different in that a free magnetic layer 84 has a three-layer artificial ferrimagnetic structure. The magnetization of the magnetic layer 50 of the lower pinned magnetic layer 24 is fixed in a direction antiparallel to the magnetization direction of the magnetic layer 62 of the upper pinned magnetic layer 28. As a result, the magnetization of the magnetic layer 52 of the lower pinned magnetic layer 24 is oriented in a direction antiparallel to the magnetization direction of the magnetic layer 60 of the upper pinned magnetic layer 28.

The free magnetic layer 84 includes a first free magnetic layer 85, a nonmagnetic interlayer 86, a second free magnetic layer 87, a nonmagnetic interlayer 88, and a third free magnetic layer 89. The magnetizations of the first free magnetic layer 85 and the second free magnetic layer 87 are oriented antiparallel by RKKY interaction with the nonmagnetic interlayer 86. Also, the magnetizations of the second free magnetic layer 87 and the third free magnetic layer 89 are oriented antiparallel by RKKY interaction with the nonmagnetic interlayer 88.

By giving the free magnetic layer 84 the artificial ferrimagnetic structure, a spin flop magnetic field, which fixes the magnetization directions of the first free magnetic layer 85, the second free magnetic layer 87, and the third free magnetic layer 89 antiparallel to each other, is increased to twice or more the spin flop magnetic field of the free magnetic layer 26 having the two-layer artificial ferrimagnetic structure shown in FIGS. 1 to 7. Thus, a longitudinal bias magnetic field is prevented from disturbing the antiparallel states of the magnetization direction of the first free magnetic layer 85, the second free magnetic layer 87, and the third free magnetic layer 89. Consequently, the single domain structure of the entire free magnetic layer becomes stable and Barkhausen noise is extremely reduced.

The materials of the lower pinned magnetic layer 24, the free magnetic layer 84, and the upper pinned magnetic layer 28 of the magnetic detecting element shown in FIG. 8 are selected as follows.

Case 1

The first free magnetic layer 85, the magnetic layer 52 of the lower pinned magnetic layer 24, the third free magnetic layer 89 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The second free magnetic layer 87 and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, A of FeA alloy is an element selected from the group consisting of Mn, Cr, V, Ti, Ru, Mo, Os, Re, and W.

The lower nonmagnetic material layer 25 is formed of Cu. The nonmagnetic interlayer 86 of the free magnetic layer 84 is a laminate composed of a first layer 90 formed of Cu and a second layer 91 formed of Cr. The nonmagnetic interlayer 88 is also a laminate composed of a first layer 92 formed of Cr and a second layer 93 formed of Cu. The upper nonmagnetic material layer 27 is also a laminate composed of a first layer 72 formed of Cu and a second layer 73 formed of Cr.

Case 2

The first free magnetic layer 85, the magnetic layer 52 of the lower pinned magnetic layer 24, and the third free magnetic layer 89 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The second free magnetic layer 87 and the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and Co Mn-D is an element selected from the group consisting of Al, Ga, Si, Ge, and Sn.

The lower nonmagnetic material layer 25 is formed of Cr. One nonmagnetic interlayer 86 of the free magnetic layer 84 is a laminate composed of a first layer 90 formed of Cr and a second layer 91 formed of Cu. The other nonmagnetic interlayer 88 is also a laminate composed of a first layer 92 formed of Cu and a second layer 93 formed of Cr. The upper nonmagnetic material layer 27 is also a laminate composed of a first layer 72 formed of Cr and a second layer 73 formed of Cu.

The magnetic layer 50 of the lower pinned magnetic layer 24 is formed of the same material as that of the magnetic layer 52 and the magnetic layer 62 of the upper pinned magnetic layer 28 is formed of the same material as that of the magnetic layer 60.

When the NiX alloys, CoT alloys, FeZ alloys, and Co—Mn—D alloys belong to group A and the NiM alloys, CoQ alloys, and FeA alloys belong to group B, the alloys belonging to group A are magnetic materials satisfying the relationship $\beta>0$, and the alloys belonging to group B are magnetic materials satisfying the relationship <0.

$\beta$ is a characteristic value of a magnetic material, satisfying the relationship $\rho\downarrow/\rho\uparrow=(1+\beta)/(1-\beta)(-1\leq\beta\leq1)$, where $\rho\downarrow$ is the specific resistance for minority conduction electrons, and $\rho\uparrow$ is the specific resistance for majority conduction electrons. Hence, when $\beta$ is positive ($\beta>0$), the relationship $\rho\downarrow>\rho\uparrow$ holds and majority conduction electrons flow in the magnetic material more easily than minority conduction electrons. In contrast, when $\beta$ is negative ($\beta<0$), the relationship $\rho\downarrow<\rho\uparrow$ holds and minority conduction electrons flow in the magnetic material more easily.

The signs of $\gamma$ at the interfaces between the magnetic layer 52 of the lower pinned magnetic layer 24 and the lower nonmagnetic material layer 25, between the lower nonmagnetic material layer 25 and the first free magnetic layer 85, between the first free magnetic layer 85 and the nonmagnetic interlayer 86, between the nonmagnetic interlayer 86 and the second free magnetic layer 87, between the second free magnetic layer 87 and the nonmagnetic interlayer 88, between the nonmagnetic interlayer 88 and the third free magnetic layer 89, between the third free magnetic layer 89 and the upper nonmagnetic material layer 27, between the upper nonmagnetic material layer 27 and the magnetic layer 60 of the upper pinned magnetic layer 28 are the same as the signs of $\beta$ values of the respective magnetic layers in contact with the interfaces.

$\gamma$ is a characteristic value of an interface, satisfying the relationship $r\downarrow/r\uparrow=(1+\gamma)/(1-\gamma)(-1\leq\gamma\leq1)$, where $r\downarrow$ is interface resistance for minority conduction electrons, and $r\uparrow$ is interface resistance for majority conduction electrons. Hence, when $\gamma$ is positive ($\gamma>0$), the relationship $r\downarrow>r\uparrow$ holds and majority conduction electrons flow more easily than minority conduction electrons. In contrast, when $\gamma$ is negative ($\gamma<0$), the relationship $r\downarrow<r\uparrow$ holds and minority conduction electrons flow more easily.

When a current flows in a conductive material, conduction electrons change the direction of their spins after traveling a certain distance. A distance at which the conduction electrons travel without changing the direction of their spins is referred to as a spin diffusion length. A conductive material has a specific spin diffusion length.

In the present embodiment, the thickness t10 of the first free magnetic layer 85, the thickness t11 of the nonmagnetic interlayer 86, the thickness t12 of the second free magnetic layer 87, the thickness t13 of the nonmagnetic interlayer 88, the thickness t14 of the third free magnetic layer, the thickness t4 of the lower nonmagnetic material layer 25, and the thickness t5 of the upper nonmagnetic material layer 27 are all smaller than the spin diffusion lengths of the materials constituting the respective layers.

Therefore, when, for example, the conduction electrons involved in the magnetoresistance effect are up-spin, these up-spin conduction electrons travel through the lower nonmagnetic material layer 25, the first free magnetic layer 85, the nonmagnetic interlayer 86, the second free magnetic layer 87, the nonmagnetic interlayer 88, the third free magnetic layer 89, and the upper nonmagnetic material layer 27, maintaining the uniformity of the spin direction.

For example, the spin diffusion lengths are: 150 Å in $Co_{90}Fe_{10}$; 120 Å in $Ni_{80}Fe_{20}$; 50 Å in $Ni_{97}Cr_3$; 90 Å in $Fe_{95}Cr_5$; 40 Å in $Fe_{80}Cr_{20}$; 1000 Å in Cu; and 100 Å in Cr.

Figure 9:
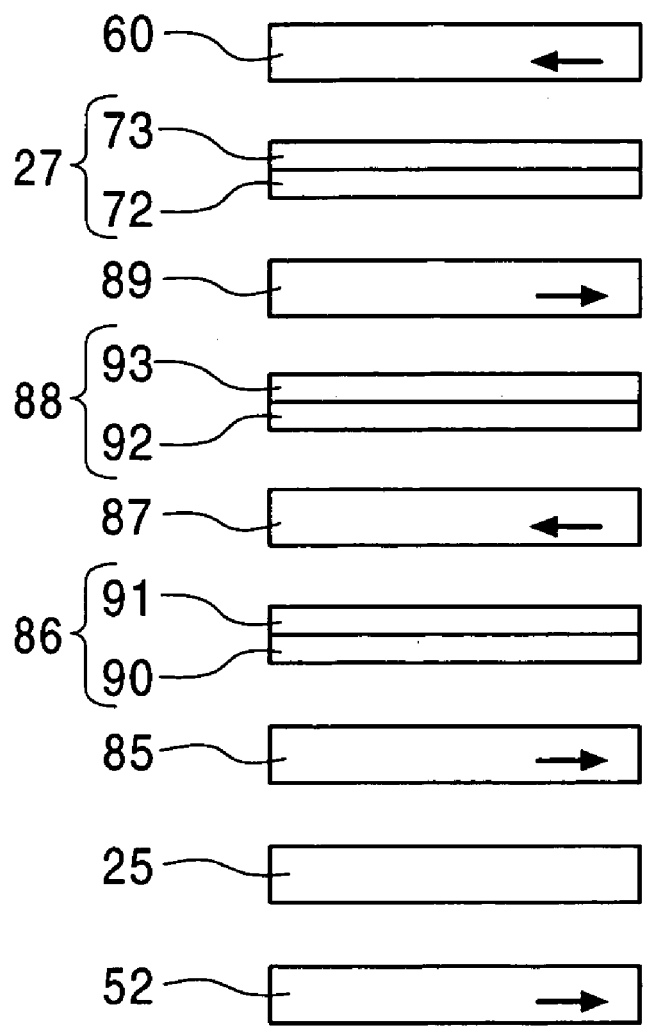
FIG. 9 is a schematic illustration of a combination of the signs of β of magnetic layers and signs of γ at interfaces of the magnetic layers with nonmagnetic layers in a magnetic detecting element of the present invention.

FIG. 9 shows the relationships between the magnetic layers and the characteristic values β and γ in the combinations of Case 1 and Case 2, and schematically shows layers involved in a magnetoresistance effect of the magnetic detecting element shown in FIG. 8. The arrows shown in the magnetic layer 52 of the lower pinned magnetic layer 24, the first free magnetic layer 85, the second free magnetic layer 87, the third free magnetic layer 89, and the magnetic layer 60 of the upper pinned magnetic layer 28 designate their magnetization directions. The majority spin in the magnetic layers in which the magnetization is oriented rightward shown in the figure is up-spin, and the majority spin in the magnetic layers in which the magnetization is oriented leftward is down-spin. The magnetization directions of the first free magnetic layer 85, the second free magnetic layer 87, and the third free magnetic layer 89 are those when the magnetic detecting element exhibits the lowest resistance.

FIG. 9 suggests that, in Case 1, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the down-spin conduction electrons.

Also, in Case 2, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the up-spin conduction electrons.

Therefore, the difference between the ease of conduction electron flow in a low resistance state and that in a high resistance state can be increased, and, thus, the change in the product ΔR·A can be increased.

The lower pinned magnetic layer 24, the lower nonmagnetic material layer 25, the free magnetic layer 84, the upper nonmagnetic material layer 27, and the upper pinned magnetic layer 28 may be formed with the following combination of materials.

Case 3

The first free magnetic layer 85, the third free magnetic layer 89, and the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The magnetic layer 52 of the lower pinned magnetic layer 24 and the second free magnetic layer 87 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The lower nonmagnetic material layer 25 is a laminate composed of a first layer 74 formed of Cr and a second layer 75 formed of Cu. The nonmagnetic interlayer 86 of the free magnetic layer 84 is a laminate composed of a first layer 90 formed of Cu and a second layer 91 formed of Cr. The nonmagnetic interlayer 88 is also a laminate composed of a first layer 92 formed of Cr and a second layer 93 formed of Cu. The upper nonmagnetic material layer 27 is formed of Cu.

Case 4

The first free magnetic layer 85, the third free magnetic layer 89, and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The magnetic layer 52 of the lower pinned magnetic layer 24 and the second free magnetic layer 87 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The lower nonmagnetic material layer 25 is a laminate composed of a first layer 74 formed of Cu and a second layer 75 formed of Cr. The nonmagnetic interlayer 86 of the free magnetic layer 84 is a laminate composed of a first layer 90 formed of Cr and a second layer 91 formed of Cu. The nonmagnetic interlayer 88 is a laminate composed of a first layer 92 formed of Cu and a second layer 93 formed of Cr. The upper nonmagnetic material layer 27 is formed of Cr.

Figure 10:
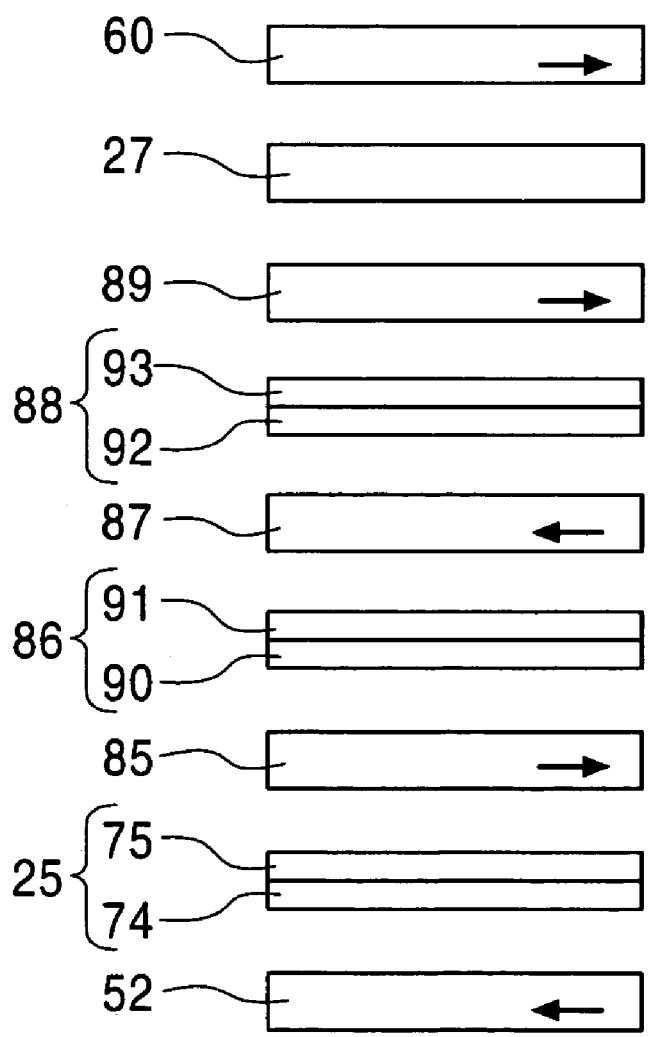
FIG. 10 is a schematic illustration of a combination of the signs of β of magnetic layers and signs of γ at interfaces of the magnetic layers with nonmagnetic layers in a magnetic detecting element of the present invention.

FIG. 10 shows the relationships between the magnetic layers and the characteristic values β and γ in the combinations of Case 3 and Case 4. The arrows shown in the magnetic layer 52 of the lower pinned magnetic layer 24, the first free magnetic layer 85, the second free magnetic layer 87, the third free magnetic layer 89, and the magnetic layer 60 of the upper pinned magnetic layer 28 designate their magnetization directions. FIG. 10 is different from FIG. 9 in that the lower nonmagnetic material layer 25 has a two-layer structure composed of a first layer 74 and a second layer 75, but the upper nonmagnetic material layer 27 has a single-layer structure.

The majority spin in the magnetic layers in which the magnetization is oriented rightward shown in the figure is up-spin, and the majority spin in the magnetic layers in which the magnetization is oriented leftward is down-spin. The magnetization directions of the first free magnetic layer 85, the second free magnetic layer 87, and the third free magnetic layer 89 are those when the magnetic detecting element exhibits the lowest resistance.

FIG. 10 suggests that, in Case 3, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the down-spin conduction electrons.

Also, in Case 4, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the up-spin conduction electrons.

Therefore, the difference between the ease of conduction electron flow in a low resistance state and that in a high resistance state can be increased, and, thus, the change in the product ΔR·A can be increased.

In FIGS. 9 and 10, the magnetization directions of the magnetic layer 52 of the lower pinned magnetic layer 24 and the magnetic layer 60 of the upper pinned magnetic layer 28 are antiparallel.

Figure 11:
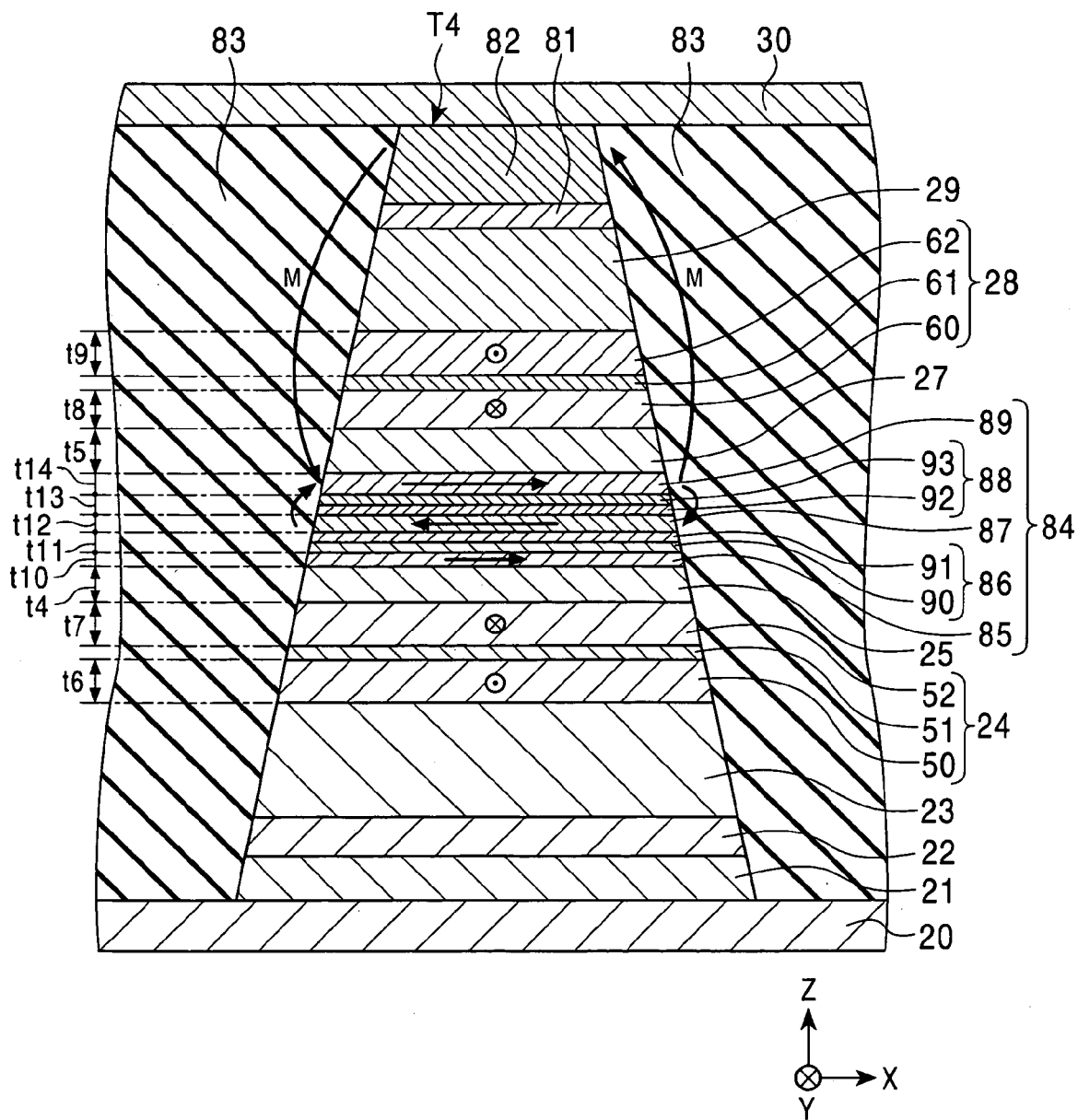
FIG. 11 is a sectional view of a magnetic detecting element according to a fifth embodiment of the present invention, viewed from a side opposing a recording medium.

FIG. 11 is a fragmentary sectional view of the structure of a magnetic detecting element according to a fifth embodiment of the present invention, viewed from a side opposing a recording medium.

The magnetic detecting element shown in FIG. 11 is different from the magnetic detecting element shown in FIG. 8 in that only the nonmagnetic interlayers 86 and 88 of the free magnetic layer 84 have a two-layer structure but the lower nonmagnetic material layer 25 and the upper nonmagnetic material layer 27 do not. The magnetization of the magnetic layer 50 of the lower pinned magnetic layer 24 is fixed parallel to the magnetization direction of the magnetic layer 62 of the upper pinned magnetic layer 28. As a result, the magnetizations of the magnetic layer 52 of the lower pinned magnetic layer 24 is oriented in a direction parallel to the magnetization direction of the magnetic layer 60 of the upper pinned magnetic layer 28.

The other layers designated by the same reference numerals as in FIG. 8 are formed of the same materials and the same thicknesses, and the description is not repeated.

The materials of the lower pinned magnetic layer 24, the free magnetic layer 84, and the upper pinned magnetic layer 28 of the magnetic detecting element shown in FIG. 11 are selected as follows.

Case 1

The first free magnetic layer 85, the third free magnetic-layer 89, the magnetic layer 52 of the lower pinned magnetic layer 24, and the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D is Co—Mn—D alloy is an element selected from the group consisting of Al, Ga, Si, Ge, and Sn.

The second free magnetic layer 87 is formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The lower nonmagnetic material layer 25 is formed of Cu. The nonmagnetic interlayer 86 of the free magnetic layer 84 is a laminate composed of a first layer 90 formed of Cu and a second layer 91 formed of Cr. The nonmagnetic interlayer 88 is also a laminate composed of a first layer 92 formed of Cr and a second layer 93 formed of Cu. The upper nonmagnetic material layer 27 is formed of Cu.

Case 2

The first free magnetic layer 85, the third magnetic layer 89, the magnetic layer 52 of the lower pinned magnetic layer 24, and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The second free magnetic layer 87 is formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The lower nonmagnetic material layer 25 is formed of Cr. The nonmagnetic interlayer 86 of the free magnetic layer 84 is a laminate composed of a first layer 90 formed of Cr and a second layer 91 formed of Cu. The nonmagnetic interlayer 88 is also a laminate composed of a first layer 92 formed of Cu and a second layer 93 formed of Cr. The upper nonmagnetic material layer 27 is formed of Cr.

The magnetic layer 50 of the lower pinned magnetic layer 24 is formed of the same material as that of the magnetic layer 52 and the magnetic layer 62 of the upper pinned magnetic layer 28 is formed of the same material as that of the magnetic layer 60.

When the NiX alloys, CoT alloys, FeZ alloys, and Co—Mn—D alloys belong to group A, and the NiM alloys, CoQ alloys, and FeA alloys belong to group B, the alloys belonging to group A are magnetic materials satisfying the relationship β>0, and the alloys belonging to group B are magnetic materials satisfying the relationship β<0, as above.

The signs of γ at the interfaces between the magnetic layer 52 of the lower pinned magnetic layer 24 and the lower nonmagnetic material layer 25, between the lower nonmagnetic material layer 25 and the first free magnetic layer 85, between the first free magnetic layer 85 and the nonmagnetic interlayer 86, between the nonmagnetic interlayer 86 and the second free magnetic layer 87, between the second free magnetic layer 87 and the nonmagnetic interlayer 88, between the nonmagnetic interlayer 88 and the third free magnetic layer 89, between the third free magnetic layer 89 and the upper nonmagnetic material layer 27, between the upper nonmagnetic material layer 27 and the magnetic layer 60 of the upper pinned magnetic layer 28 are the same as the signs of β values of the respective magnetic layers in contact with the interfaces.

In the present embodiment, the thickness t10 of the first free magnetic layer 85, the thickness t11 of the nonmagnetic interlayer 86, the thickness t12 of the second free magnetic layer 87, the thickness t13 of the nonmagnetic interlayer 88, the thickness t14 of the third free magnetic layer, the thickness t4 of the lower nonmagnetic material layer 25, and the thickness t5 of the upper nonmagnetic material layer 27 are all smaller than the spin diffusion lengths of the materials constituting the respective layers.

Therefore, when, for example, the conduction electrons involved in the magnetoresistance effect are in an up-spin state, the up-spin conduction electrons travel through the lower nonmagnetic material layer 25, the first free magnetic layer 85, the nonmagnetic interlayer 86, the second free magnetic layer 87, the nonmagnetic interlayer 88, the third free magnetic layer 89, and the upper nonmagnetic material layer 27, maintaining the uniformity of the spin direction.

For example, the spin diffusion lengths are: 150 Å in $Co_{90}Fe_{10}$; 120 Å in $Ni_{80}Fe_{20}$; 50 Å in $Ni_{97}Cr_3$; 90 Å in $Fe_{95}Cr_5$; 40 Å in $Fe_{80}Cr_{20}$; 1000 Å in Cu; and 100 Å in Cr.

Figure 12:
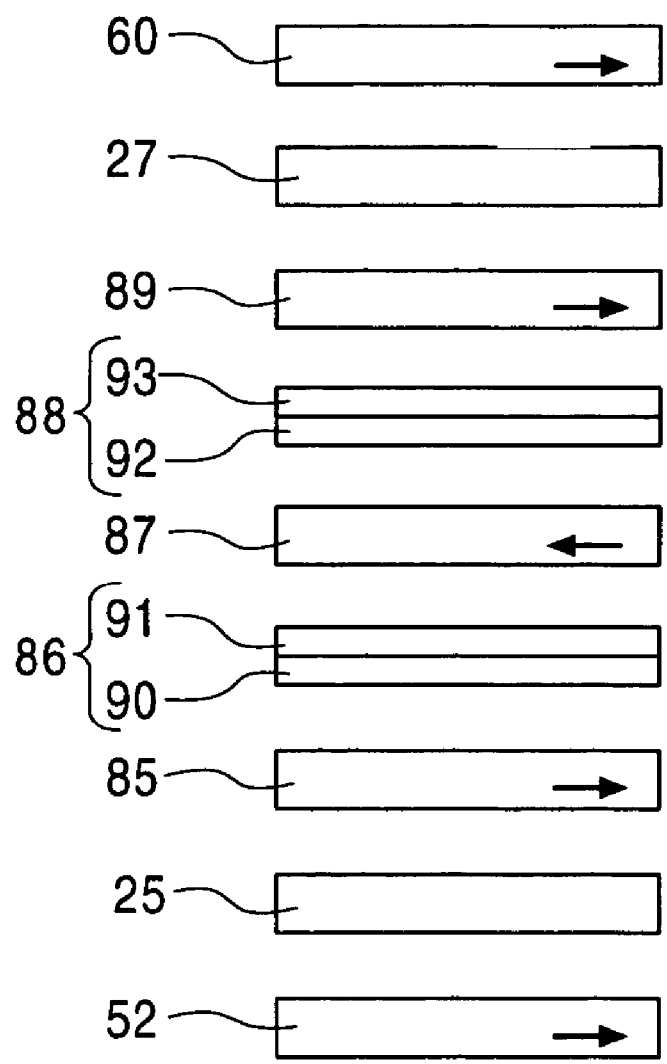
FIG. 12 is a schematic illustration of a combination of the signs of β of magnetic layers and signs of γ at interfaces of the magnetic layers with nonmagnetic layers in a magnetic detecting element of the present invention.

FIG. 12 shows the relationships between the magnetic layers and the characteristic values $\beta$ and $\gamma$ in the combinations of Case 1 and Case 2, and schematically shows layers involved in a magnetoresistance effect of the magnetic detecting element shown in FIG. 11. The arrows shown in the magnetic layer 52 of the lower pinned magnetic layer 24, the first free magnetic layer 85, the second free magnetic layer 87, the third free magnetic layer 89, and the magnetic layer 60 of the pinned magnetic layer 28 designate their magnetization directions. The majority spin in the magnetic layers in which the magnetization is oriented rightward shown in the figure is up-spin, and the majority spin in the magnetic layers in which the magnetization is oriented leftward is down-spin. The magnetization directions of the first free magnetic layer 85, the second free magnetic layer 87, and the third free magnetic layer 89 are those when the magnetic detecting element exhibits the lowest resistance.

FIG. 12 suggests that, in Case 1, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the down-spin conduction electrons.

Also, in Case 2, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the up-spin conduction electrons.

Therefore, the difference between the ease of conduction electron flow in a low resistance state and that in a high resistance state can be increased, and, thus, the change in the product $\Delta R \cdot A$ can be increased.

The lower pinned magnetic layer 24, the lower nonmagnetic material layer 25, the free magnetic layer 84, the upper nonmagnetic material layer 27, and the upper pinned magnetic layer 28 may be formed with the following combination of materials.

Case 3

The second free magnetic layer 87, the magnetic layer 52 of the lower pinned magnetic layer 24, the magnetic layer 60 of the upper pinned magnetic layer 28 are formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co, Rh, Pt, Ir, Be, Al, Si, Ga, and Ge, and D of the Co—Mn—D alloy is an element selected from the group consisting of Al, Ga, Si, Ge, and Sn.

The first free magnetic layer 85 and the third free magnetic layer 89 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The lower nonmagnetic material-layer 25 is a laminate composed of a first layer 74 formed of Cu and a second layer 75 formed of Cr. The nonmagnetic interlayer 86 of the free magnetic layer 84 is a laminate composed of a first layer 90 formed of Cr and a second layer 91 formed of Cu. The nonmagnetic interlayer 88 is a laminate composed of a first layer 92 formed of Cu and a second layer 93 formed of Cr. The upper nonmagnetic material layer 27 is a laminate composed of a first layer 72 formed of Cr and a second layer 73 formed of Cu.

Case 4

The second free magnetic layer 87, the magnetic layer 52 of the lower pinned magnetic layer 24, and the magnetic layer 60 of the upper pinned magnetic layer 28 are formed of a NiM alloy, a CoQ alloy, or an FeA alloy, wherein M of the NiM alloy is an element selected from the group consisting of Cr, Rh, Ru, Mo, Nb, Pt, Ir, Os, Re, W, and Ta, Q of the CoQ alloy is an element selected from the group consisting of Mn, Cr, Ru, Mo, Ir, Os, Re, and W, and A of the FeA alloy is an element selected from the group consisting of Mn, Cr, V, Ti, Ru, Mo, Os, Re, and W.

The first free magnetic layer 85 and the third free magnetic layer 89 is formed of a NiX alloy, a CoT alloy, a FeZ alloy, or a Co—Mn—D alloy, wherein X of the NiX alloy is an element selected from the group consisting of Co, Fe, Mn, Zr, Hf, Cu, and Au, T of the CoT alloy is an element selected from the group consisting of Fe, Zr, Ta, and Hf, Z of the FeZ alloy is an element selected from the group consisting of Ni, Co., Rh, Pt, Ir, Be, Al, Si, Ga, and Ge, and D of the Co—Mn—D alloy is an element selected from the group consisting of Al, Ga, Si, Ge, and Sn.

The lower nonmagnetic material layer 25 is a laminate composed of a first layer 74 formed of Cr and a second layer 75 formed of Cu. The nonmagnetic interlayer 86 of the free magnetic layer 84 is a laminate composed of a first layer 90 formed of Cu and a second layer 91 formed of Cr. The nonmagnetic interlayer 88 is also a laminate composed of a first layer 92 formed of Cr and a second layer 93 formed of Cu. The upper nonmagnetic material layer 27 is a laminate composed of a first layer 72 formed of Cu and a second layer 73 formed of Cr.

Figure 13:
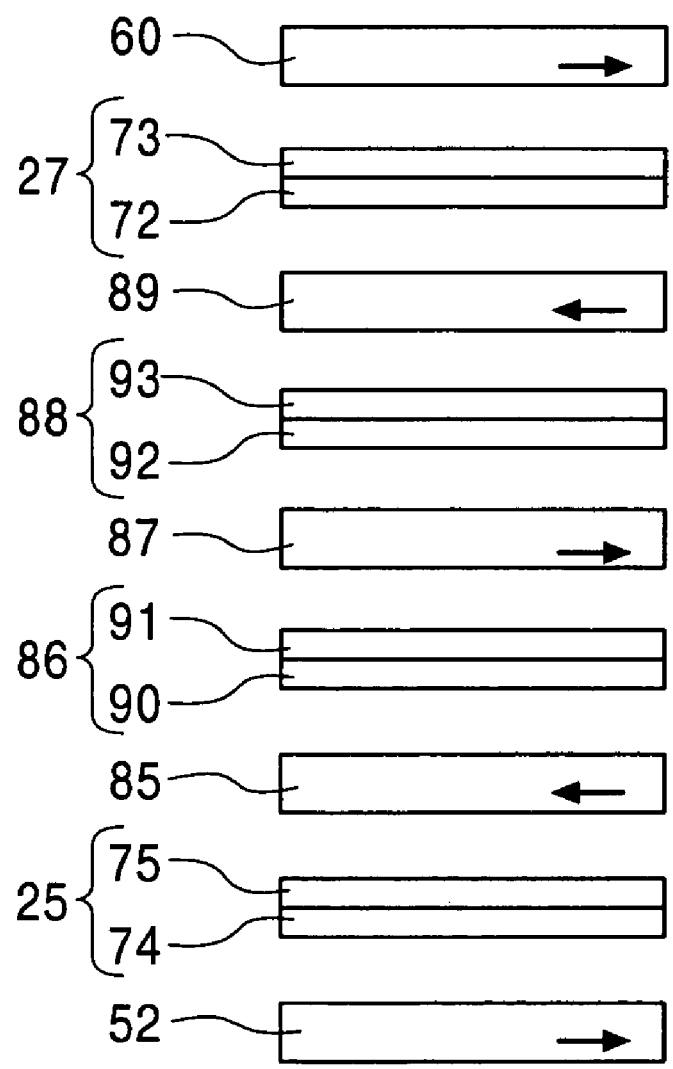
FIG. 13 is a schematic illustration of a combination of the signs of β of magnetic layers and signs of γ at interfaces of the magnetic layers with nonmagnetic layers in a magnetic detecting element of the present invention.
Figure 14:
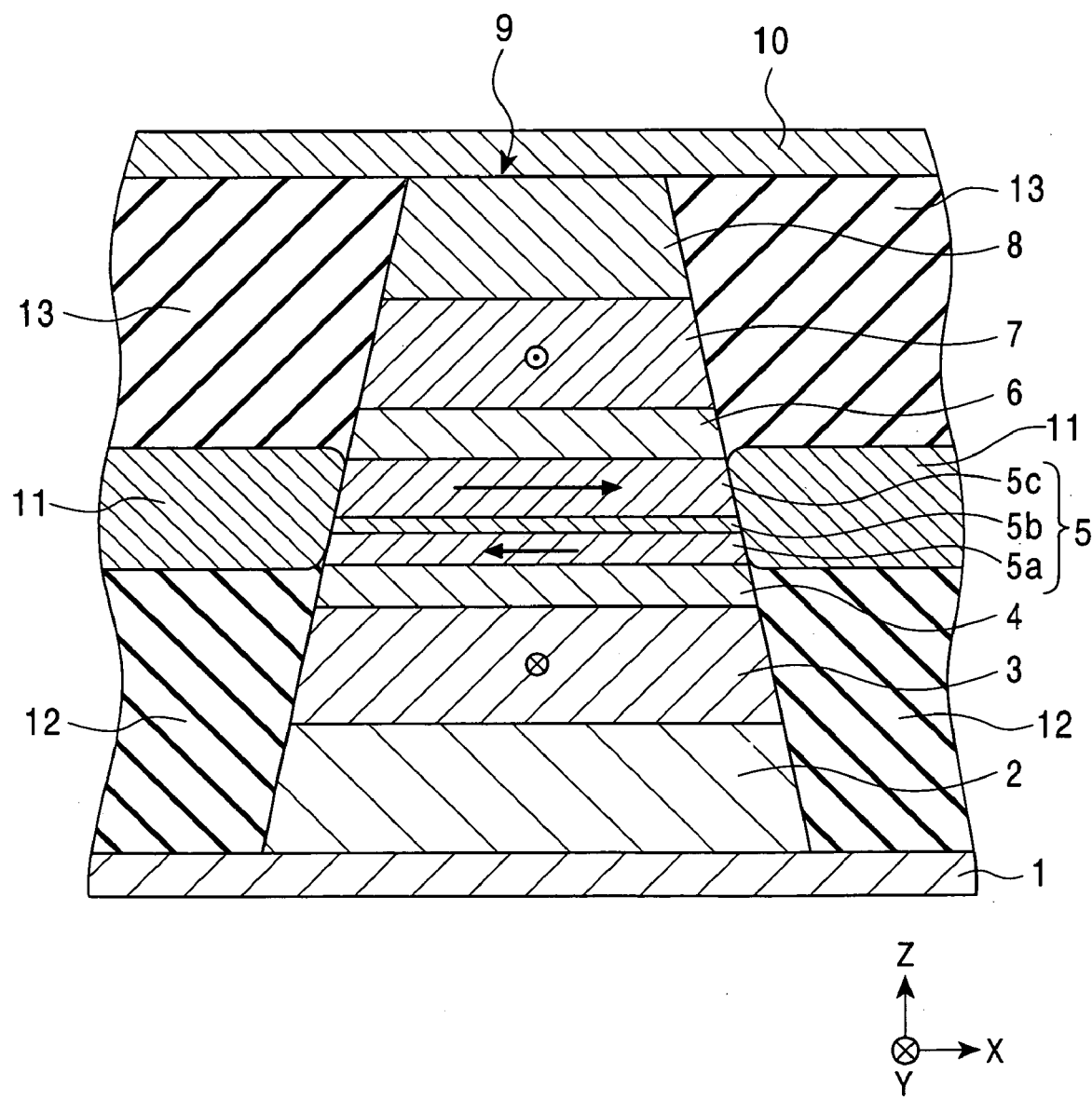
FIG. 14 is a sectional view of a known magnetic detecting element, viewed from a side opposing a recording medium.
Figure 15:
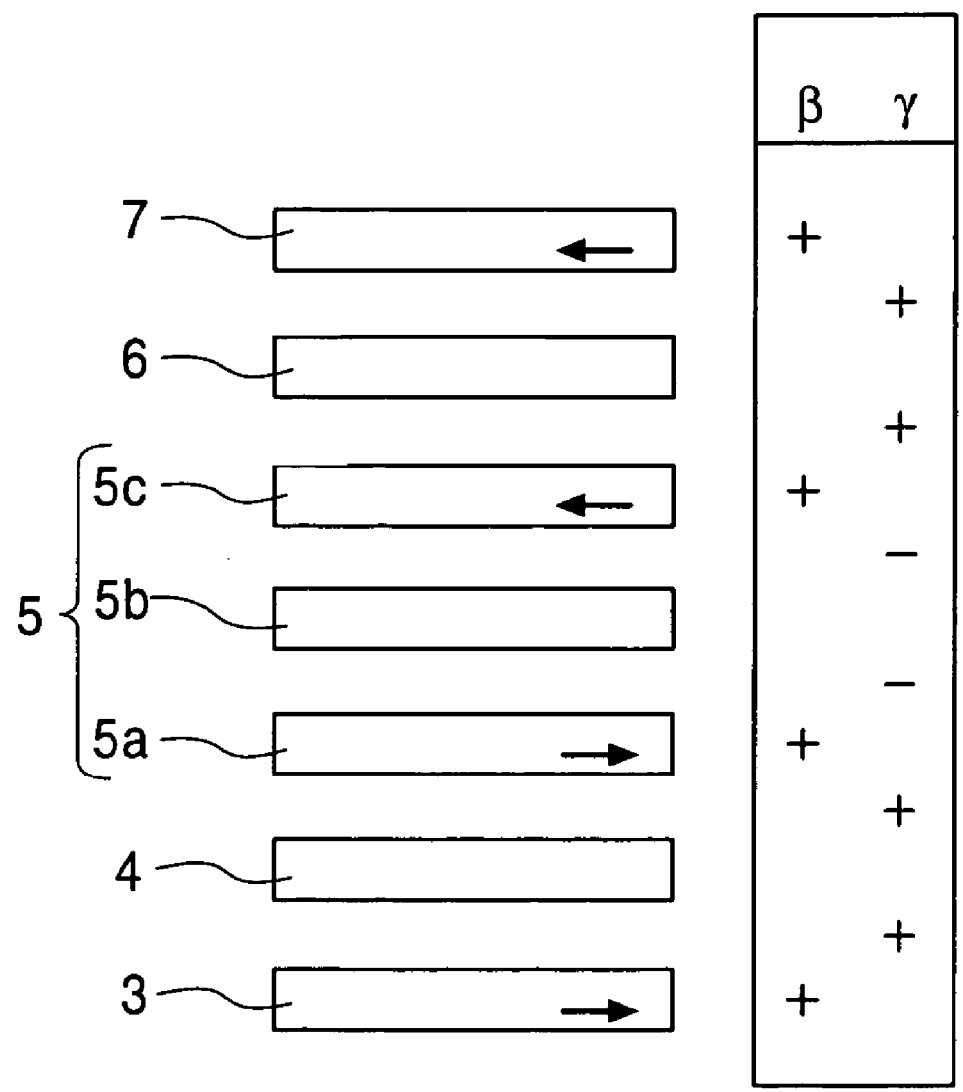
FIG. 15 is a schematic illustration of a combination of the signs of β of magnetic layers and signs of γ at interfaces of the magnetic layers with nonmagnetic layers in a magnetic detecting element of the present invention.
Figure 15:
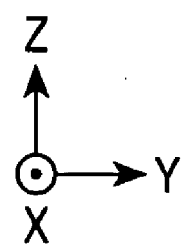

FIG. 13 shows the relationships between the magnetic layers and the characteristic values $\beta$ and $\gamma$ in the combinations of Case 3 and Case 4. The arrows shown in the magnetic layer 52 of the lower pinned magnetic layer 24, the first free magnetic layer 85, the second free magnetic layer 87, the third free magnetic layer 89, and the magnetic layer 60 of the pinned magnetic layer 28 designate their magnetization directions. FIG. 13 is different from FIG. 12 in that the lower nonmagnetic material layer 25 has a two-layer structure composed of the first layer 74 and the second layer 75 and the upper nonmagnetic material layer 27 also has a two-layer structure composed of the first layer 72 and the second layer 73.

The majority spin in the magnetic layers in which the magnetization is oriented rightward shown in the figure is up-spin, and the majority spin in the magnetic layers in which the magnetization is oriented leftward is down-spin, as above. The magnetization directions of the first free magnetic layer 85, the second free magnetic layer 87, and the third free magnetic layer 89 are those when the magnetic detecting element exhibits the lowest resistance.

FIG. 13 suggests that, in Case 3, the resistances of all the magnetic layers for the up-spin conduction electrons are smaller than those for the down-spin conduction electrons, and that the interface resistances for the up-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the down-spin conduction electrons.

Also, in Case 4, the resistances of all the magnetic layers for the down-spin conduction electrons are smaller than those for the up-spin conduction electrons, and the interface resistances for the down-spin conduction electrons at all the interfaces of the magnetic layers with the nonmagnetic layers (lower nonmagnetic material layer 25, nonmagnetic interlayers 86 and 88, upper nonmagnetic material layer 27) are smaller than those for the up-spin conduction electrons.

Therefore, the difference between the ease of conduction electron flow in a low resistance state and that in a high resistance state can be increased, and, thus, the change in the product $\Delta R \cdot A$ can be increased.

In FIGS. 12 and 13, the magnetizations of the magnetic layer 52 of the lower pinned magnetic layer 24 and the magnetic layers 60 of the upper pinned magnetic layer 28 are oriented parallel to each other.

Although, in the magnetic detecting elements shown in FIGS. 8 and 11, the in-stack bias layer 82 applies a longitudinal bias magnetic field to the free magnetic layer 84, a hard bias layer as shown in FIG. 1 may apply the longitudinal bias magnetic field to the free magnetic layer 84.

A process for manufacturing the magnetic detecting element shown in FIG. 1 will now be described.

First, all over the middle of the first electrode layer 20 are successively deposited the underlayer 21; the seed layer 22; the lower antiferromagnetic layer 23; the magnetic layer 50, nonmagnetic interlayer 51, and magnetic layer 52 of the lower pinned magnetic layer 24; the lower nonmagnetic material layer 25; the first free magnetic layer 53, nonmagnetic interlayer 54, second free magnetic layer 55 of the free magnetic layer 26; the upper nonmagnetic material layer 27; the magnetic layer 60, nonmagnetic interlayer 61, and magnetic layer 62 of the upper pinned magnetic layer 28; and the upper antiferromagnetic layer 29, in that order from below, in a vacuum, to form the multilayer laminate T1. The material and thickness of each layer is the same as those of the completed magnetic detecting element shown in FIG. 1.

The multilayer laminate T1 is subjected to annealing in a magnetic field in the height direction (Y direction) to generate an exchange coupling magnetic field between the lower antiferromagnetic layer 23 and the magnetic layer 50 of the lower pinned magnetic layer 24 and between the upper antiferromagnetic layer 29 and the magnetic layer 62 of the upper pinned magnetic layer 28.

The temperature of the magnetic field annealing is set at, for example, 270° C., and the intensity of the magnetic field is set as high as 800 kA/m, or in the range of 8 to 30 kA/m, for example, 24 kA/m.

The material layers 50 and 52 of the lower pinned magnetic layer 24 are formed of a magnetic material having the same composition, and the thickness t6 of the magnetic layer 50 is set to be smaller than the thickness t7 of the magnetic layer 52. Also, the magnetic layers 60 and 62 of the upper pinned magnetic layer 28 are formed of a magnetic material having the same composition, and the thickness t9 of the magnetic layer 62 is set to be smaller than the thickness t8 of the magnetic layer 60.

Hence, the following relationships hold: magnetic moment per area of the magnetic layer 50<magnetic moment per area of the magnetic layer 52; and magnetic moment per area of the magnetic layer 62<magnetic moment per area of the magnetic layer 60.

The magnetizations of the magnetic layers 50 and 62 are fixed in the direction antiparallel to the height direction (Y direction) by the above-described annealing in a magnetic field of 8 to 30 kA/m, and the magnetizations of the magnetic layers 52 and 60 are fixed in the height direction (Y direction) by RKKY interaction with the respective nonmagnetic interlayers 51 and 61.

By annealing in a magnetic field of 800 kA/m or more, the magnetizations of the magnetic layers 50 and 62 are fixed in the height direction (Y direction in the figure).

Next, a lift-off resist layer is provided on the upper antiferromagnetic layer 29 to cover an area slightly smaller than or equal to the optical area of the magnetic detecting element.

Then, the region of the multilayer laminate including the layers from the upper antiferromagnetic layer 29 to the underlayer 21 is removed by ion milling or the like. Thus, the multilayer laminate T1 remains in a substantially trapezoidal shape, on the upper surface of the middle of the first electrode layer 20. Since part of the material removed by ion milling redeposits on both side surfaces S1 of the multilayer laminate T1, it is preferable to remove the redeposition by side milling.

Next, from the upper surface of the first electrode 20 to both sides S1 of the multilayer laminate T1 are deposited the insulating layer 31 of $Al_2O_3$ or the like, the bias underlayer 32 of Cr or the like, the hard bias layer 33 of CoPtCr or the like, and the insulating layer 34 of $Al_2O_3$ or the like, by sputtering.

Preferably, the exposure angle of sputtering particles for the insulating layers 31 and 34 is set in a direction substantially perpendicular to the substrate.

After depositing the layers from the insulating layer 31 to the insulating layer 34, the resist layer is removed.

Then, the second electrode layer 30 is deposited from the upper surface of the insulating layer 34 to the upper surface of the antiferromagnetic layer 29 by sputtering. Thus, the magnetic detecting element shown in FIG. 1 is completed.

If the magnetic layer 52 of the lower pinned magnetic layer 24 is fixed in the height direction (Y direction) and the magnetic layer 60 of the upper pinned magnetic layer 28 is fixed in the direction antiparallel to the height direction, as in the magnetic detecting element shown in FIG. 4, the thickness of each magnetic layer is set as follows.

Specifically, the material layers 50 and 52 of the lower pinned magnetic layer 24 are formed of a magnetic material having the same composition, and the thickness t6 of the magnetic layer 50 is set to be smaller than the thickness t7 of the magnetic layer 52 (t6<t7). Also, the magnetic layers 60 and 62 of the upper pinned magnetic layer 28 are formed of a magnetic material having the same composition, and the thickness t9 of the magnetic layer 62 is set to be larger than the thickness t8 of the magnetic layer 60 (t9>t8).

Hence, The relationships: magnetic moment per area of the magnetic layer 50<magnetic moment per area of the magnetic layer 52; and magnetic moment per area of the magnetic layer 62>magnetic moment per area of the magnetic layer 60 hold. Thus, the magnetization directions of the magnetic layer 52 and the magnetic layer 60 are set to be antiparallel by annealing only once in a magnetic field lower than a spin flop magnetic field during manufacture of the magnetic detecting element shown in FIG. 4.

When the thickness t6 of the magnetic layer 50 is set to be larger than the thickness t7 of the magnetic layer 52 (t6 >t7) and the thickness t9 of the magnetic layer 62 is set to be smaller than the thickness t8 of the magnetic layer 60 (t9 <t8), the magnetization directions of the magnetic layer 52 and the magnetic layer 60 can also be set to be antiparallel by a magnetic field annealing only once.

Alternatively, the following method may be applied to set the magnetization directions of the magnetic layer 52 of the lower pinned magnetic layer 24 and the magnetic layer 60 of the upper pinned magnetic layer 28 to be antiparallel.

First, all over the middle of the first electrode layer 20 are successively deposited the underlayer 21; the seed layer 22; the lower antiferromagnetic layer 23; the magnetic layer 50, nonmagnetic interlayer 51, and magnetic layer 52, of the lower pinned magnetic layer 24; the lower nonmagnetic material layer 25; the first free magnetic layer 53, nonmagnetic interlayer 54, and second free magnetic layer 55 of the free magnetic layer 26; the upper nonmagnetic material layer 27; the magnetic layer 60, nonmagnetic interlayer 61, and magnetic layer 62 of the upper pinned magnetic layer 28; and part of the upper antiferromagnetic layer 29 (a thickness not causing an antiferromagnetic field, for example, 50 Å or less), in that order from below, in a vacuum, and a first annealing is performed in a magnetic field.

After the first annealing, the thickness of the upper antiferromagnetic layer 29 is increased to a level more than or equal to the level capable of generating an antiferromagnetism, and a second annealing is performed in a magnetic field in a direction antiparallel to the magnetic field of the first annealing.

By performing magnetic annealing twice, the magnetization directions of the magnetic layer 52 of the lower pinned magnetic layer 24 and the magnetic layer 60 of the upper pinned magnetic layer 28 can be set to be antiparallel even when the magnetic layers 50 and 52 of the lower pinned magnetic layer are formed of a magnetic material having the same composition such that the thickness t6 of the magnetic layer 50 is larger than or equal to the thickness t7 of the magnetic layer 52 (t6≧t7) and when the magnetic layers 60 and 62 of the upper pinned magnetic layer 28 are formed of a magnetic material having the same composition such that the thickness t9 of the magnetic layer 62 is larger than or equal to the thickness t8 of the magnetic layer 60 (t9≧t8). Also, when the thickness t6 of the magnetic layer 50 is set to be smaller than or equal to the thickness t7 of the magnetic layer 52 (t6≦t7), and when the thickness t9 of the magnetic layer 62 is set to be smaller than or equal to the thickness t8 of the magnetic layer 60 (t9≦t8), the same goes.

In a structure satisfying the relationships t6>t7 and 9≧8 or 6≦7 and 9≦8, it is easy to adjust the intensities of the unidirectional anisotropic magnetic fields Hex* between the lower antiferromagnetic layer 23 and the lower pinned magnetic layer 24 and between the upper antiferromagnetic layer 29 and the upper pinned magnetic layer 28 to a similar level.

In the above-described embodiments, the signs of β and γ are optimized in terms of specific resistance and interface resistance for up-spin or down-spin conduction electrons. In the present invention, only γ of magnetic layers or only γ of interfaces may be adjusted as in the embodiments. For example, each magnetic layer may be formed of a material whose β value satisfies any one of the combinations shown in the embodiments, and each nonmagnetic material layer and each nonmagnetic interlayer may be formed of Cu and Ru, respectively.

What is claimed is:

1. A magnetic detecting element comprising a multilayer laminate comprising:
   a free magnetic layer including a first free magnetic layer, a second free magnetic layer, and a nonmagnetic interlayer between the first free magnetic layer and the second free magnetic layer;
   a lower nonmagnetic material layer, a lower pinned magnetic layer, and a lower antiferromagnetic layer underlying the free magnetic layer; and
   an upper nonmagnetic material layer, an upper pinned magnetic layer, and an upper antiferromagnetic layer overlying the free magnetic layer;
   wherein current flows in a direction perpendicular to a surface of each layer of the multilayer laminate, and
   wherein β of a material constituting one of the first free magnetic layer and the second free magnetic layer has the same sign as β of magnetic materials constituting the lower pinned magnetic layer and the upper pinned magnetic layer, and β of a magnetic material of the other free magnetic layer has a different sign from β of the magnetic materials constituting the lower pinned magnetic layer and the upper pinned magnetic layer, β being a characteristic value of a magnetic material satisfying the expression: $\rho\downarrow/\rho\uparrow=(1+\beta)/(1-\beta)$ $(-1\leq\beta\leq1)$, where $\rho\downarrow$ is specific resistance for minority conduction electrons, and $\rho\downarrow$ is specific resistance for majority conduction electrons.

2. A magnetic detecting element according to claim 1, wherein the first free magnetic layer, the nonmagnetic interlayer, the second free magnetic layer, the lower nonmagnetic material layer, and the upper nonmagnetic material layer each have a thickness smaller than a specific spin diffusion length of the respective materials thereof.

3. A magnetic detecting element according to claim 2, wherein γ of each interface of the first free magnetic layer, the second free magnetic layer, the lower pinned magnetic layer, and the upper pinned magnetic layer with the nonmagnetic material layers and the nonmagnetic interlayer has the same sign as β of the magnetic layer in contact with the interface, wherein γ is a characteristic value of an interface, satisfying the relationship $r\downarrow/r\uparrow=(1+\gamma)/(1-\gamma)(-1\leq\gamma\leq1)$, where $r\downarrow$ is the interface resistance for minority conduction electrons and $r\uparrow$ is the interface resistance for majority conduction electrons.

4. A magnetic detecting element according to claim 3, wherein at least one of the nonmagnetic material layers and the nonmagnetic interlayer has two layers comprising different materials, so that γ of the interface of the upper surface of said at least of the nonmagnetic material layers and the nonmagnetic interlayer with the corresponding magnetic layer has a different sign from γ of the interface of the lower surface of said at least one of the nonmagnetic material layers and the nonmagnetic interlayer with the corresponding magnetic layer.

5. A magnetic detecting element comprising a multilayer laminate comprising:
   a free magnetic layer including a first free magnetic layer, a second free magnetic layer, and a nonmagnetic interlayer between the first free magnetic layer and the second free magnetic layer;
   a lower nonmagnetic material layer, a lower pinned magnetic layer, and a lower antiferromagnetic underlying the free magnetic layer; and an upper nonmagnetic material layer, an upper pinned magnetic layer, and an upper antiferromagnetic layer overlying the free magnetic layer;

wherein current flows in a direction perpendicular to a surface of each layer of the multilayer laminate, and wherein β of a material constituting the first free magnetic layer has a sign that is the same as β of a material constituting one of the lower pinned magnetic layer and the upper pinned magnetic layer, and different from β of magnetic materials constituting the second free magnetic layer and the other pinned magnetic layer, β being a characteristic value of a magnetic material satisfying the expression: $\rho\downarrow/\rho\uparrow=(1+\beta)/(1-\beta)(-1\leq\beta\leq1)$, where $\rho\downarrow$ is specific resistance for minority conduction electrons, and $\rho\uparrow$ is specific resistance for majority conduction electrons.

6. A magnetic detecting element according to claim 5, wherein the first free magnetic layer, the nonmagnetic interlayer, the second free magnetic layer, the lower nonmagnetic material layer, and the upper nonmagnetic material layer each have a thickness smaller than the specific spin diffusion length of the respective materials thereof.

7. A magnetic detecting element according to claim 6, wherein γ of each interface of the first free magnetic layer, the second free magnetic layer, the lower pinned magnetic layer, and the upper pinned magnetic layer with the nonmagnetic material layers and the nonmagnetic interlayer has the same sign as β of the magnetic layer in contact with the interface, wherein γ is a characteristic value of an interface, satisfying the relationship $r\downarrow/r\uparrow=(1+\gamma)/(1-\gamma)(-1\leq\gamma\leq1)$, where $r\downarrow$ is the interface resistance for minority conduction electrons and $r\uparrow$ is the interface resistance for majority conduction electrons.

8. A magnetic detecting element according to claim 7, wherein at least one of the nonmagnetic material layers and the nonmagnetic interlayer has two layers comprising different materials, so that γ of the interface of the upper surface of said at least of the nonmagnetic material layers and the nonmagnetic interlayer with the corresponding magnetic layer has a different sign from γ of the interface of the lower surface of said at least one of the nonmagnetic material layers and the nonmagnetic interlayer with the corresponding magnetic layer.

9. A magnetic detecting element according to claim 5, wherein γ of each interface of the first free magnetic layer, the second free magnetic layer, the lower pinned magnetic layer, and the upper pinned magnetic layer with the nonmagnetic material layers and the nonmagnetic interlayer has the same sign as β of the magnetic layer in contact with the interface, wherein γ is a characteristic value of an interface, satisfying the relationship $r\downarrow/r\uparrow=(1+\gamma)/(1-\gamma)(-1\leq\gamma\leq1)$, where $r\downarrow$ is the interface resistance for minority conduction electrons and $r\uparrow$ is the interface resistance for majority conduction electrons.

10. A magnetic detecting element according to claim 9, wherein at least one of the nonmagnetic material layers and the nonmagnetic interlayer has two layers comprising different materials, so that γ of the interface of the upper surface of said at least of the nonmagnetic material layers and the nonmagnetic interlayer with the corresponding magnetic layer has a different sign from γ of the interface of the lower surface of said at least one of the nonmagnetic material layers and the nonmagnetic interlayer with the corresponding magnetic layer.

11. A magnetic detecting element comprising a multilayer laminate comprising:

a free magnetic layer including a first free magnetic layer, a second free magnetic layer, and a nonmagnetic interlayer between the first free magnetic layer and the second free magnetic layer;

a lower nonmagnetic material layer, a lower pinned magnetic layer, and a lower antiferromagnetic underlying the free magnetic layer; and an upper nonmagnetic material layer, an upper pinned magnetic layer, and an upper antiferromagnetic layer overlying the free magnetic layer;

wherein current flows in a direction perpendicular to a surface of each layer of the multilayer laminate, and wherein the first free magnetic layer, the second free magnetic layer, the lower pinned magnetic layer, and the upper pinned magnetic layer each comprise an alloy selected from group A consisting of NiX alloys, CoT alloys, FeZ alloys, and Co—Mn—D alloy and group B consisting of NiM alloys, CoQ alloys, and FeA alloys, one of the first free magnetic layer and the second free magnetic layer, the lower pinned magnetic layer, and the upper pinned magnetic layer comprise an alloy belonging to one of group A and group B, and the other free magnetic layer comprises an alloy belonging to the other group, where X of the NiX alloys is an element selected from the group consisting of Co, Fe, Mn, Zr, Hf, Cu, and Au, T of the CoT alloys is an element selected from the group consisting of Fe, Zr, Ta, and Hf, Z of the FeZ alloys is an element selected from the group consisting of Ni, Co, Rh, Pt, Ir, Be, Al, Si, Ga, and Ge, D of the Co—Mn—D alloys is an element selected from the group consisting of Al, Ga, Si, Ge, and Sn, M of the NiM alloys is an element selected from the group consisting of Cr, Rh, Ru, Mo, Nb, Pt, Ir, Os, Re, W, and Ta, Q of the CoQ alloys is an element selected from the group consisting of Mn, Cr, Ru, Mo, Ir, Os, Re, and W, and A of the FeA alloys is an element selected from the group of Mn, Cr, V, Ti, Ru, Mo, Os, Re, and W.

12. A magnetic detecting element comprising a multilayer laminate comprising:

a free magnetic layer including a first free magnetic layer, a second free magnetic layer, and a nonmagnetic interlayer between the first free magnetic layer and the second free magnetic layer;

a lower nonmagnetic material layer, a lower pinned magnetic layer, and a lower antiferromagnetic underlying the free magnetic layer; and an upper nonmagnetic material layer, an upper pinned magnetic layer, and an upper antiferromagnetic layer overlying the free magnetic layer;

wherein current flows in a direction perpendicular to a surface of each layer of the multilayer laminate, and wherein the first free magnetic layer, the second free magnetic layer, the lower pinned magnetic layer, and the upper pinned magnetic layer each comprise an alloy selected from group A consisting of NiX alloys, CoT alloys, FeZ alloys, and Co—Mn—D alloy and group B consisting of NiM alloys, CoQ alloys, and FeA alloys, the first free magnetic layer and one of the lower pinned magnetic layer and the upper pinned magnetic layer comprise an alloy belonging to one of group A and group B, and the second free magnetic layer and the other pinned magnetic layer comprise an alloy belonging to the other group, where X of the NiX alloys is an element selected from the group consisting of Co, Fe, Mn, Zr, Hf, Cu, and Au, T of the CoT alloys is an element selected from the group consisting of Fe, Zr, Ta, and Hf, Z of the FeZ alloys is an element selected from the group consisting of Ni, Co, Rh, Pt, Ir, Be, Al, Si, Ga, and Ge, D of the Co—Mn—D alloys is an element selected from the group consisting of Al, Ga, Si, Ge, and Sn, M of the NiM alloys is an element selected from the group consisting of Cr, Rh, Ru, Mo, Nb, Pt, Ir, Os, Re, W, and Ta, Q of the CoQ alloys is an element selected from the group consisting of Mn, Cr, Ru, Mo, Ir, Os, Re, and W, and A of the FeA alloys is an element selected from the group of Mn, Cr, V, Ti, Ru, Mo, Os, Re, and W.

13. A magnetic detecting element according to claim 12, wherein the first free magnetic layer, the nonmagnetic interlayer, the second free magnetic layer, the lower nonmagnetic material layer, and the upper nonmagnetic material layer each have a thickness smaller than a specific spin diffusion length of the respective materials thereof.

* * * * *